US010274972B2

(12) United States Patent
Amikura et al.

(10) Patent No.: US 10,274,972 B2
(45) Date of Patent: Apr. 30, 2019

(54) METHOD OF INSPECTING GAS SUPPLY SYSTEM

(71) Applicant: Tokyo Electron Limited, Tokyo (JP)

(72) Inventors: Norihiko Amikura, Miyagi (JP); Risako Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 143 days.

(21) Appl. No.: 15/263,490

(22) Filed: Sep. 13, 2016

(65) Prior Publication Data

US 2017/0075361 A1 Mar. 16, 2017

(30) Foreign Application Priority Data

Sep. 16, 2015 (JP) ................ 2015-183081
Jan. 21, 2016 (JP) ................ 2016-009851

(51) Int. Cl.
*G05D 7/06* (2006.01)
*F16K 31/00* (2006.01)
*G05B 15/02* (2006.01)
*F16K 37/00* (2006.01)
*F17D 5/00* (2006.01)
*G01F 23/00* (2006.01)

(52) U.S. Cl.
CPC ......... *G05D 7/0635* (2013.01); *F16K 31/004* (2013.01); *F16K 37/0075* (2013.01); *F17D 5/00* (2013.01); *G01F 23/00* (2013.01); *G05B 15/02* (2013.01)

(58) Field of Classification Search
CPC .................................. F16K 37/0075
USPC ................................... 73/861.351
See application file for complete search history.

(56) References Cited

U.S. PATENT DOCUMENTS 6,182,501 B1 * 2/2001 Furuse ............... G01M 3/3263
73/49.2

FOREIGN PATENT DOCUMENTS

JP 08338546 A * 12/1996 .......... G05D 7/0635
JP 3291161 B2 3/2002
(Continued)

OTHER PUBLICATIONS

Hong et al., "Effect of Oxygen Pressure upon composition variation during chemical vapor deposition growth of lead titanate films from tetraethyl lead and titanium tetraispopropoxide" Material Letters issue 46, Nov. 2000, pp. 149-153 by Hong (Year: 2000).*

*Primary Examiner* — Emilio J Saavedra
(74) *Attorney, Agent, or Firm* — Pearne & Gordon LLP

(57) ABSTRACT

A flow rate of a gas supplied into a processing vessel of a substrate processing apparatus is controlled according to a set flow rate of a first flow rate controller. The gas is also supplied into a second flow rate controller. When an output flow rate of the first flow rate controller is in a steady state, a first pressure measurement value of a first pressure gauge and a second pressure measurement value of a second pressure gauge of the second flow rate controller are obtained. A difference absolute value between the first pressure measurement value and a reference pressure value and a difference absolute value between the second pressure measurement value and a reference pressure value are calculated, and then, an average value of the difference absolute values is calculated. The difference absolute values and the average value are respectively compared with a first to third threshold value.

15 Claims, 21 Drawing Sheets

(56) References Cited

FOREIGN PATENT DOCUMENTS

| JP | 2003195948 A | * | 7/2003 | ........... G05D 7/0635 |
|----|-------------:|---|--------|-------------------------|
| JP | 4102564 B2   |   | 3/2008 |                         |
| JP | 4866682 B2   |   | 11/2011|                         |

* cited by examiner

METHOD OF INSPECTING GAS SUPPLY SYSTEM

CROSS-REFERENCE TO RELATED APPLICATION

This application claims the benefit of Japanese Patent Application Nos. 2015-183081 and 2016-009851 filed on Sep. 16, 2015 and Jan. 21, 2016, respectively, the entire disclosures of which are incorporated herein by reference.

TECHNICAL FIELD

The embodiments described herein pertain generally to a method of inspecting a gas supply system configured to supply a gas into a processing vessel of a substrate processing apparatus.

BACKGROUND

In a substrate processing apparatus such as a plasma processing apparatus, a substrate is processed with a gas supplied from a gas supply system into a processing vessel of the substrate processing apparatus. In the substrate processing apparatus, multiple kinds of processes may be performed in sequence. For the purpose, the gas supply system may be configured to control flow rates of one or more gases selected from multiple kinds of gases and supply the one or more gases into the processing vessel.

To elaborate, the gas supply system includes a multiple number of first lines, a multiple number of first valves, a multiple number of flow rate controllers, a multiple number of second lines, a multiple number of second valves, a third line and a third valve. The first lines are respectively connected to a plurality of gas sources. The first valves are respectively provided at the first lines. The flow rate controllers are respectively provided at the downstream sides of the first lines. The second lines are respectively provided at the downstream sides of the flow rate controllers. The second valves are respectively provided at the second lines. The third line is connected to the second lines. The third valve is provided at the third line. The third line is connected to the processing vessel at the downstream side thereof.

Each of the flow rate controllers may be implemented by a pressure type flow rate controller as described in Patent Documents 1 to 3. The flow rate controller of this type includes an orifice, a control valve, a first pressure gauge and a second pressure gauge. The control valve is provided at the upstream side of the orifice. The first pressure gauge is configured to measure an internal pressure of the line between the control valve and the orifice. The second pressure gauge is configured to measure an internal pressure of the line at the downstream side of the orifice. In this pressure type flow rate controller, the control valve is controlled according to a set flow rate. When a pressure measurement value of the first pressure gauge is equal to or larger than twice a pressure measurement value of the second pressure gauge, the control valve is controlled to reduce a difference between the set flow rate and an output flow rate calculated from the pressure measurement value of the first pressure gauge. Further, when the pressure measurement value of the first pressure gauge is smaller than twice the pressure measurement value of the second pressure gauge, the control valve is controlled to reduce a difference between the set flow rate and an output flow rate calculated from a difference between the pressure measurement value of the first pressure gauge and the pressure measurement value of the second pressure gauge.

Patent Document 1: Japanese Patent No. 3,291,161
Patent Document 2: Japanese Patent No. 4,102,564
Patent Document 3: Japanese Patent No. 4,866,682

A state of the gas supply system may be changed as an operating time of the substrate processing apparatus passes by. If the state of the gas supply system is changed from its previous state, the flow rate of the gas supplied into the processing vessel to process the current substrate may become different from the flow rate of the gas which is supplied into the processing vessel to process the previous substrate, though the gas is supplied into the processing vessel of the substrate processing apparatus according to the same process recipe. Accordingly, there may be caused a problem that the state of the substrate processed previously and the state of the substrate to be processed next are different. Thus, it is required to inspect the gas supply system.

SUMMARY

In one exemplary embodiment, there is provided a method of inspecting a gas supply system configured to supply a gas into a processing vessel of a substrate processing apparatus. Here, the gas supply system includes multiple first lines, multiple first valves, multiple flow rate controllers, multiple second lines, multiple second valves, a third line and a third valve. The first lines are respectively connected to multiple gas sources. The first valves are respectively provided at the first lines. The flow rate controllers are respectively provided at downstream sides of the first lines and respectively connected to the first lines. The second lines are respectively provided at downstream sides of the flow rate controllers and respectively connected to the flow rate controllers. The second valves are respectively provided at the second lines. The third line is provided at downstream sides of the second lines and connected to the second lines. The third valve is provided at the third line. Further, the third line is connected to the processing vessel at a downstream side thereof. Moreover, each of the flow rate controllers includes an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line.

The method includes (i) controlling a flow rate of the gas supplied into the processing vessel via a first flow rate controller among the flow rate controllers, the flow rate of the gas being controlled according to a set flow rate in the first flow rate controller (hereinafter, referred to as "flow rate controlling process"); (ii) opening, in a processing period during which the flow rate controlling process is performed, one or more second valves, among the second valves, which are provided at downstream sides of one or more second flow rate controllers, among the flow rate controllers, which do not perform the controlling of the flow rate of the gas; (iii) calculating one or more first difference absolute values and one or more second difference absolute values, each of the one or more first difference absolute values being a difference absolute value between a first reference steady pressure value and a first steady pressure value measured by the first pressure gauge of each of the one or more second flow rate controllers in a steady period during which an output flow rate of the first flow rate controller is in a steady state, each of the one or more second difference absolute values being a difference absolute value between a second reference steady pressure value and a second steady pressure value measured by the second pressure gauge of each of the one or more second flow rate controllers in the steady period, each of the first reference steady pressure value and the second reference steady pressure value being set prior to the processing period, and the first reference steady pressure value and the second reference steady pressure value being pressure measurement values measured by the first pressure gauge and the second pressure gauge of each of the one or more second flow rate controllers, respectively, when the output flow rate of the first flow rate controller, through which the flow rate of the gas supplied into the processing vessel is controlled according to the set flow rate, is in the steady state; (iv) calculating an average value of the one or more first difference absolute values and the one or more second difference absolute values; and (v) determining whether each of the one or more first difference absolute values is larger than a first threshold value, whether each of the one or more second difference absolute values is larger than a second threshold value, or whether the average value is large than a third threshold value.

In the method according to the exemplary embodiment, the gas output from the first flow rate controller at the flow rate according to the set flow rate during the processing period is supplied into the fourth line and the fifth line of the one or more second flow rate controllers as well as into the processing vessel. Accordingly, one or more first steady pressure values and one or more second steady pressure values reflect the output flow rate of the first flow rate controller in the steady state. Further, the first reference steady pressure value is a first steady pressure value acquired when the output flow rate of the first flow rate controller, which is outputting the gas according to the same set flow rate in a period (hereinafter, referred to as "reference period") prior to the processing period, is in the steady state. Further, the second reference steady pressure value is a second steady pressure value acquired when an output flow rate of the second flow rate controller, which is outputting the gas according to the same set flow rate in the reference period, is in the steady state. Accordingly, by determining whether each of the one or more first different absolute values is larger than the first threshold value, whether each of the one or more second difference absolute values is larger than the second threshold value or whether the average value is large than the third threshold value, it is possible to determine whether the output flow rate of the first flow rate controller in the steady state during the processing period is changed from the output flow rate of the first flow rate controller in the steady state during the reference period. Thus, in the method according to the present exemplary embodiment, it is possible to inspect the gas supply system. Furthermore, if each of the one or more first difference absolute values is larger than the first threshold value, each of the one or more second difference absolute values is larger than the second threshold value or the average value is larger than the third threshold value, an alarm signal may be output from a control unit of the substrate processing apparatus, or the process currently being performed in the substrate processing apparatus may be stopped by the control unit of the substrate processing apparatus.

The one or more second flow rate controllers may be multiple second flow rate controllers, among the flow rate controllers, which do not perform the controlling of the flow rate of the gas in the processing period. Further, the one or more first difference absolute values may be multiple first difference absolute values obtained by calculating the difference absolute value between the first reference steady pressure value and the first steady pressure value measured by the first pressure gauge of each of the multiple second flow rate controllers in the steady period, and the one or more second difference absolute values may be multiple second difference absolute values obtained by calculating the difference absolute value between the second reference steady pressure value and the second steady pressure value measured by the second pressure gauge of each of the multiple second flow rate controller in the steady period. Moreover, the average value may be an average value of the multiple first difference absolute values and the multiple second difference absolute values. In the determining, it may be determined whether each of the multiple first difference absolute values is larger than the first threshold value, whether each of the multiple second difference absolute values is larger than the second threshold value, or whether the average value is larger than the third threshold value. According to the exemplary embodiment, since the pressure measurement values of the first pressure gauges and the second pressure gauges of the multiple second flow rate controllers are used, it is possible to detect with higher precision whether the output flow rate of the first flow rate controller in the steady state during the processing period is changed from the output flow rate of the first flow rate controller in the steady state during the reference period.

The method may further include calculating a sum value of pressure measurement values of the second pressure gauge of the first flow rate controller at multiple time points for a transient period prior to the steady period within the processing period; and comparing the sum value with a preset reference value. Here, the preset reference value may be a sum value of the pressure measurement values of the second pressure gauge of the first flow rate controller for the transient period within the reference period. The pressure measurement values of the second pressure gauge of the first flow rate controller used in this exemplary embodiment reflect the output flow rate of the first flow rate controller. Accordingly, the sum value reflects a transient characteristic of the output flow rate of the first flow rate controller during the processing period. By comparing the sum value with the preset reference value, it can be determined whether the transient characteristic of the output flow rate of the first flow rate controller during the processing period is changed to an unallowable extent. If an absolute value of a difference between the sum value and the preset reference value is equal to or larger than a predetermined value, it may be determined that the transient characteristic of the output flow rate of the first flow rate controller during the processing period is changed to the unallowable extent. Furthermore, if it is determined that the transient characteristic of the output flow rate of the first flow rate controller during the processing period is changed to the unallowable extent, an alarm signal may be output from the control unit of the substrate processing apparatus, or the process currently being performed in the substrate processing apparatus may be stopped by the control unit of the substrate processing apparatus.

The method may further include calculating a sum value of pressure measurement values of the first pressure gauge of the one or more second flow rate controllers at multiple time points for a transient period prior to the steady period within the processing period; and comparing the sum value with a preset reference value. Here, the preset reference value may be a sum value of the pressure measurement values of the first pressure gauge of the second flow rate controllers at multiple times points for the transient period within the reference period. The pressure measurement values of the first pressure gauge of the second flow rate controller used in this exemplary embodiment also reflect the output flow rate of the first flow rate controller. Accordingly, by comparing the sum value with the preset reference value, it can be determined whether the transient characteristic of the output flow rate of the first flow rate controller during the processing period is changed to an unallowable extent. If an absolute value of a difference between the sum value and the preset reference value is equal to or larger than a predetermined value, it may be determined that the transient characteristic of the output flow rate of the first flow rate controller during the processing period is changed to the unallowable extent. Furthermore, if it is determined that the transient characteristic of the output flow rate of the first flow rate controller during the processing period is changed to the unallowable extent, an alarm signal may be output from the control unit of the substrate processing apparatus, or the process currently being performed in the substrate processing apparatus may be stopped by the control unit of the substrate processing apparatus.

In another exemplary embodiment, there is provided a method of inspecting a gas supply system configured to supply a gas into a processing vessel of a substrate processing apparatus. Here, the gas supply system includes multiple first lines, multiple first valves, multiple flow rate controllers, multiple second lines, multiple second valves, a third line and a third valve. The first lines are respectively connected to multiple gas sources. The first valves are respectively provided at the first lines. The flow rate controllers are respectively provided at downstream sides of the first lines and respectively connected to the first lines. The second lines are respectively provided at downstream sides of the flow rate controllers and respectively connected to the flow rate controllers. The second valves are respectively provided at the second lines. The third line is provided at downstream sides of the second lines and connected to the second lines. The third valve is provided at the third line. Further, the third line is connected to the processing vessel at a downstream side thereof. Moreover, each of the flow rate controllers includes an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line. Furthermore, the gas supply system further includes a third pressure gauge configured to measure an internal pressure of the third line.

The method includes (i) controlling a flow rate of the gas supplied into the processing vessel via a first flow rate controller among the flow rate controllers, the flow rate of the gas being controlled according to a set flow rate in the first flow rate controller; (ii) calculating a difference absolute value between a reference steady pressure value and a steady pressure value measured by the third pressure gauge in a steady period during which an output flow rate of the first flow rate controller is in a steady state, the reference steady pressure value being set prior to a processing period during which the controlling of the flow rate of the gas is performed and being a pressure measurement value measured by the third pressure gauge when the output flow rate of the first flow rate controller, through which the flow rate of the gas supplied into the processing vessel is controlled according to the set flow rate, is in the steady state; and (iii) determining whether the difference absolute value is larger than a threshold value.

In the method according to another exemplary embodiment, the gas output from the first flow rate controller at the flow rate according to the set flow rate during the processing period is flown into the third line. Accordingly, the steady pressure value reflects the output flow rate of the first flow rate controller in the steady state. Further, the reference steady pressure value is a steady pressure value acquired by the third pressure gauge when the output flow rate of the first flow rate controller, which is outputting the gas according to the same set flow rate in a period (hereinafter, referred to as "reference period) prior to the processing period, is in the steady state. Accordingly, by determining whether the difference absolute value between the steady pressure value and the reference steady pressure value is larger than the threshold value, it is possible to determine whether the output flow rate of the first flow rate controller in the steady state during the processing period is changed from the output flow rate of the first flow rate controller in the steady state during the reference period. Thus, in the method according to the present exemplary embodiment, it is possible to inspect the gas supply system. Furthermore, if the difference absolute value is larger than the threshold value, an alarm signal may be output from a control unit of the substrate processing apparatus, or the process currently being performed in the substrate processing apparatus may be stopped by the control unit of the substrate processing apparatus.

The method may further include calculating a sum value of pressure measurement values of the third pressure gauge at multiple time points for a transient period prior to the steady period within the processing period; and comparing the sum value with a preset reference value. Here, the preset reference value may be a sum value of the pressure measurement values of the third pressure gauge for the transient period within the reference period. The pressure measurement values of the third pressure gauge used in this exemplary embodiment reflect the output flow rate of the first flow rate controller. Accordingly, the sum value reflects a transient characteristic of the output flow rate of the first flow rate controller during the processing period. By comparing the sum value with the preset reference value, it can be determined whether the transient characteristic of the output flow rate of the first flow rate controller during the processing period is changed to an unallowable extent. If an absolute value of a difference between the sum value and the preset reference value is equal to or larger than a predetermined value, it may be determined that the transient characteristic of the output flow rate of the first flow rate controller during the processing period is changed to the unallowable extent. Furthermore, if it is determined that the transient characteristic of the output flow rate of the first flow rate controller during the processing period is changed to the unallowable extent, an alarm signal may be output from the control unit of the substrate processing apparatus, or the process currently being performed in the substrate processing apparatus may be stopped by the control unit of the substrate processing apparatus.

The control valve of each of the flow rate controllers includes a piezoelectric element configured to move a valve body in order to open/close the control valve; and a driving unit including a control circuit configured to apply a voltage to the piezoelectric element. Further, the method may further include determining whether the voltage applied to the piezoelectric element of the first flow rate controller in the processing period is equal to a reference voltage which is previously set as an application voltage to the piezoelectric element when the control valve of the first flow rate controller is fully opened, and determining the output flow rate of the first flow rate controller in the processing period is smaller than the set flow rate. In case that the output flow rate of the first flow rate controller is smaller than the set flow rate even if the voltage for fully opening the control valve is applied to the piezoelectric element, it is deemed that the pressure of the gas supplied to the first flow rate controller is smaller than required. For example, in such a case, it may be considered that there may be an operational defect of the first valve at the upstream side of the first flow rate controller. According to the exemplary embodiment, by determining whether the application voltage to the piezoelectric element of the first flow rate controller is equal to the reference voltage and whether the output flow rate of the first flow rate controller in the processing period is smaller than the set flow rate, it is possible to detect insufficiency of the supply pressure of the gas at the upstream side (primary side) of the first flow rate controller. Further, when the voltage applied to the piezoelectric element during the processing period is equal to the reference voltage and, also, when the output flow rate of the first flow rate controller during the processing period is smaller than the set flow rate, an alarm signal may be output from the control unit of the substrate processing apparatus, or the process currently being performed in the substrate processing apparatus may be stopped by the control unit of the substrate processing apparatus.

The method may further include determining whether a difference between a pressure measurement value of the first pressure gauge of the first flow rate controller in the processing period and a pressure measurement value of the second pressure gauge of the first flow rate controller in the processing period is equal to or smaller than a preset value. In case that the second valve at the downstream side of the first flow rate controller is closed due to a breakdown thereof, the pressure measurement value of the first pressure gauge of the first flow rate controller and the pressure measurement value of the second pressure gauge of the first flow rate controller becomes substantially same. Accordingly, it is possible to detect the breakdown of the second valve at the downstream side of the first flow rate controller. Further, when the difference is equal to or smaller than the preset value, an alarm signal may be output from the control unit of the substrate processing apparatus, or the process currently being performed in the substrate processing apparatus may be stopped by the control unit of the substrate processing apparatus.

The method may further include determining whether, in a state that the gas within the flow rate controllers is exhausted, a pressure measurement value of the first pressure gauge of each of the flow rate controllers is larger than a first preset value or a pressure measurement value of the second pressure gauge of each of the flow rate controllers is larger than a second preset value. The first pressure gauge and the second pressure gauge are initially set to output a pressure measurement value of "0" in the state the gas within each flow rate controller is exhausted. That is, a zero-point adjustment is initially performed for the first pressure gauge and the second pressure gauge. Accordingly, in case that the pressure measurement value of the first pressure gauge of each of the flow rate controllers is larger than the first preset value in the state that the gas within the flow rate controllers is exhausted, an error of the zero-point of the first pressure gauge of the corresponding flow rate controller can be detected. Furthermore, in case that the pressure measurement value of the second pressure gauge of each of the flow rate controllers is larger than the second preset value in the state that the gas within the flow rate controllers is exhausted, an error of the zero-point of the second pressure gauge of the corresponding flow rate controller can be detected. Further, when the error of the zero-point is detected, an alarm signal may be output from the control unit of the substrate processing apparatus, or the process currently being performed in the substrate processing apparatus may be stopped by the control unit of the substrate processing apparatus.

The method may further include determining whether, in a state that the gas within the flow rate controllers is exhausted, a difference absolute value between a moving average value of pressure measurement values measured by the first pressure gauge of each of the flow rate controllers and a moving average value of pressure measurement values measured by the second pressure gauge of each of the flow rate controllers within a preset time period is equal to or larger than a preset value. If there is no error in the zero-point in each of the flow rate controllers, substantially no difference may exist between the moving average value of pressure measurement values measured by the first pressure gauge and the moving average value of the pressure measurement values measured by the second pressure gauge in the state that the gas within the flow rate controllers is exhausted. Accordingly, if the difference absolute value between the two moving average values is equal to or larger than the preset value, it means that an error in the zero-point is generated. According to the exemplary embodiment, it is possible to detect the error in the zero-point. Further, when the error in the zero-point is detected, an alarm signal may be output from the control unit of the substrate processing apparatus, or the process currently being performed in the substrate processing apparatus may be stopped by the control unit of the substrate processing apparatus.

The method may further include acquiring a first pressure measurement value measured by the first pressure gauge of each of the flow rate controllers and a second pressure measurement value measured by the second pressure gauge of each of the flow rate controllers in a state that the first valves and the second valves are closed; acquiring an initial pressure value of the second pressure gauge corresponding to the first pressure measurement value by inputting the first pressure measurement value into a preset function; and comparing the second pressure measurement value with the initial pressure value. Before the processes in the method according to the exemplary embodiment are performed, in a state that the first valves and the second valves are closed, the first pressure measurement values of the first pressure gauge of each of the flow rate controllers and the second pressure measurement values of the second pressure gauge of each of the flow rate controllers are measured while setting an internal pressure of each of the flow rate controllers to different pressures. Then, by creating a relationship between the first pressure measurement values and the corresponding second pressure measurement values, the preset function can be obtained. If the first pressure gauge and the second pressure gauge of each flow rate controller are in the normal state, the initial pressure value obtained by inputting the pressure measurement value (first pressure measurement value) of the first pressure gauge of the flow rate controller, which is measured in the state that the first valve at the upstream side of the flow rate controller and the second valve at the downstream side of the flow rate controller are closed, into the aforementioned preset function and the pressure measurement value (second pressure measurement value) of the second pressure gauge of the flow rate controller may be substantially same. Accordingly, by comparing the initial pressure value with the second pressure measurement value, it is possible to determine whether there is generated the difference between the pressure measurement value of either one of the first pressure gauge and the second pressure gauge of the flow rate controller and the initial pressure value. Further, when the difference between the second pressure measurement value and the initial pressure value is larger than a preset value, it may be determined that there is generated the difference between the pressure measurement value of either one of the first pressure gauge and the second pressure gauge of the flow rate controller and the initial pressure value. Furthermore, if it is determined that the difference between the pressure measurement value of either one of the first pressure gauge and the second pressure gauge of the flow rate controller and the initial pressure value is generated, an alarm signal may be output from the control unit of the substrate processing apparatus, or the process currently being performed in the substrate processing apparatus may be stopped by the control unit of the substrate processing apparatus.

The method may further include determining, in a state that the first valves and the second valves are closed, whether a difference absolute value between a moving average value of pressure measurement values measured by the first pressure gauge of each of the flow rate controllers and a moving average value of pressure measurement values measured by the second pressure gauge of each of the flow rate controllers within a preset time period is equal to or larger than a preset value. In case that both the first pressure gauge and the second pressure gauge of each flow rate controller is in the normal state, substantially no difference may exist between the moving average value of pressure measurement values measured by the first pressure gauge and the moving average value of pressure measurement values measured by the second pressure gauge in the state that the first valve at the upstream side of the flow rate controller and the second valve at the downstream side thereof are closed. Accordingly, if the difference absolute value between the two moving average values is equal to or larger than the preset value, it means that either the first pressure gauge or the second pressure gauge of the flow rate controller outputs a pressure measurement value having an error. Thus, according to the exemplary embodiment, it can be detected whether either one of the first pressure gauge or the second pressure gauge of each flow rate controller outputs a pressure measurement value having an error. Further, if it is detected that either one of the first pressure gauge or the second pressure gauge of each flow rate controller outputs a pressure measurement value having an error, an alarm signal may be output from the control unit of the substrate processing apparatus, or the process currently being performed in the substrate processing apparatus may be stopped by the control unit of the substrate processing apparatus.

The method may further include determining whether a preset time period has elapsed in a state that the control valve of each of the flow rate controllers is closed. It is difficult for the control valve to block the gas completely. If the closed state of the control valve lasts for a long time, it may affect the transient characteristic in a subsequent process of supplying the processing gas by opening the second valve at the downstream side of the flow rate controller. According to the exemplary embodiment, the state of the control valve that affects the transient characteristic can be detected. Further, if the preset time period has elapsed in the state that the control valve is closed, an alarm signal may be output from the control unit of the substrate processing apparatus, or the process currently being performed in the substrate processing apparatus may be stopped by the control unit of the substrate processing apparatus.

The method may further include determining whether a pressure measurement value of the first pressure gauge of each of the flow rate controllers is increased by a preset value or more when the voltage applied to the piezoelectric element of each of the flow rate controllers is equal to a reference voltage which is previously set as an application voltage to the piezoelectric element when the control valve of each flow rate controller is closed. If the pressure measurement value of the first pressure gauge is increased by the preset value or more even though the application voltage to the piezoelectric element is set to close the control valve, it is deemed that an unallowable leakage occurs in the control valve. According to the exemplary embodiment, by determining whether the pressure measurement value of the first pressure gauge of the flow rate controller is increased by the preset value or more when the application voltage to the piezoelectric element is set to close the control valve, it is possible to detect the unallowable leakage of the control valve. Further, if the leakage of the control valve occurs, an alarm signal may be output from the control unit of the substrate processing apparatus, or the process currently being performed in the substrate processing apparatus may be stopped by the control unit of the substrate processing apparatus.

The method may further include determining whether the pressure measurement value of the first pressure gauge of each of the flow rate controllers is decreased when each of the second valves is closed and the voltage applied to the piezoelectric element of each of the flow rate controllers is equal to the reference voltage. If the pressure measurement value of the first pressure gauge is decreased even though the second valve is closed and the voltage applied to the piezoelectric element is set to close the control valve, it is deemed that the leakage occurs in the second valve at the downstream side of the control valve. According to the exemplary embodiment, by determining whether the pressure measurement value of the first pressure gauge is decreased when the voltage applied to the piezoelectric element is set to close the control valve, it is possible to detect the leakage of the second valve. Further, if the leakage of the second valve occurs, an alarm signal may be output from the control unit of the substrate processing apparatus, or the process currently being performed in the substrate processing apparatus may be stopped by the control unit of the substrate processing apparatus.

According to the exemplary embodiments as described above, it is possible to inspect the gas supply system. Particularly, it is possible to determine whether the output flow rate of the first flow rate controller in the steady state in the period during which the gas is supplied into the processing vessel of the substrate processing apparatus via the first flow rate controller is changed from the output flow rate of the first flow rate controller in the steady state in the reference period.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
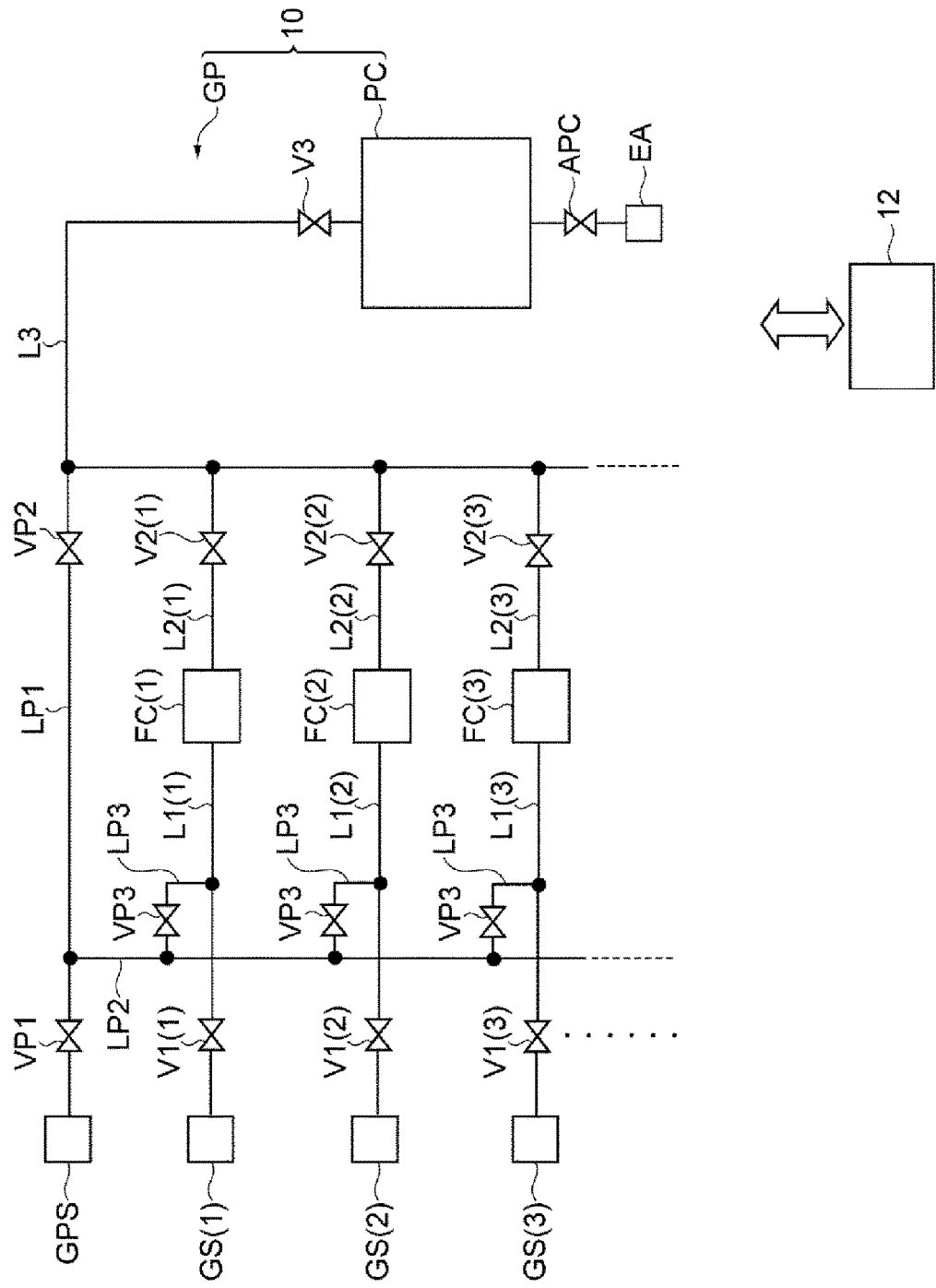
FIG. 1 is a diagram illustrating an example of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a substrate processing apparatus equipped with a gas supply system to which a method according to an exemplary embodiment is applicable will be first explained. FIG. 1 is a diagram illustrating an example of the substrate processing apparatus. The substrate processing apparatus 10 shown in FIG. 1 includes a processing vessel PC and a gas supply system GP. The processing vessel PC has an internal space therein. A substrate is accommodated in the internal space of the processing vessel PC. A gas exhaust device EA is connected to the processing vessel PC via a pressure control valve APC. The gas supply system GP is configured to supply a gas for processing the substrate into the processing vessel PC. The substrate processing apparatus 10 may be configured to perform a plasma process such as a plasma etching process on the substrate. In case that the substrate processing apparatus 10 serves as a plasma processing apparatus, the substrate processing apparatus 10 further includes a plasma source.

The gas supply system GP includes a multiple number of first lines L1, a multiple number of first valves V1, a multiple number of flow rate controllers FC, a multiple number of second lines L2, a multiple number of second valves V2, a third line L3 and a third valve V3.

Upstream ends of the first lines L1 are respectively connected to a multiple number of gas sources GS. The gas sources GS are sources of different kinds of gases. The first lines L1 are respectively equipped with the first valves V1. Downstream ends of the first lines L1 are respectively connected to the flow rate controllers FC. A configuration of each of the flow rate controllers FC will be elaborated later.

Upstream ends of the second lines L2 are respectively connected to the flow rate controllers FC. Each of the flow rate controllers FC is implemented by a pressure type flow rate controller. The second lines L2 are respectively equipped with the second valves V2. The second lines L2 join the third line L3. The third line L3 is equipped with the third valve V3. The third line L3 is connected to the processing vessel PC at the downstream side of the third valve V3.

The gas supply system GP may further include a line LP1, a valve VP1, a valve VP2 and a multiple number of lines LP3 and a multiple number of valves VP3. An upstream end of the line LP1 is connected to a source GPS of a purge gas. The purge gas may be, by way of example, but not limitation, a $N_2$ gas. The line LP1 is equipped with the valve VP1. Further, the line LP1 is also provided with the valve VP2 at the downstream side of the valve VP1. The line LP2 is branched from the line LP1 between the valve VP1 and the valve VP2. Upstream ends of the lines LP3 are connected to the line LP2, and downstream ends of the lines LP3 are respectively connected to the first lines L1. The valves VP3 are respectively provided at the lines LP3.

Figure 2:
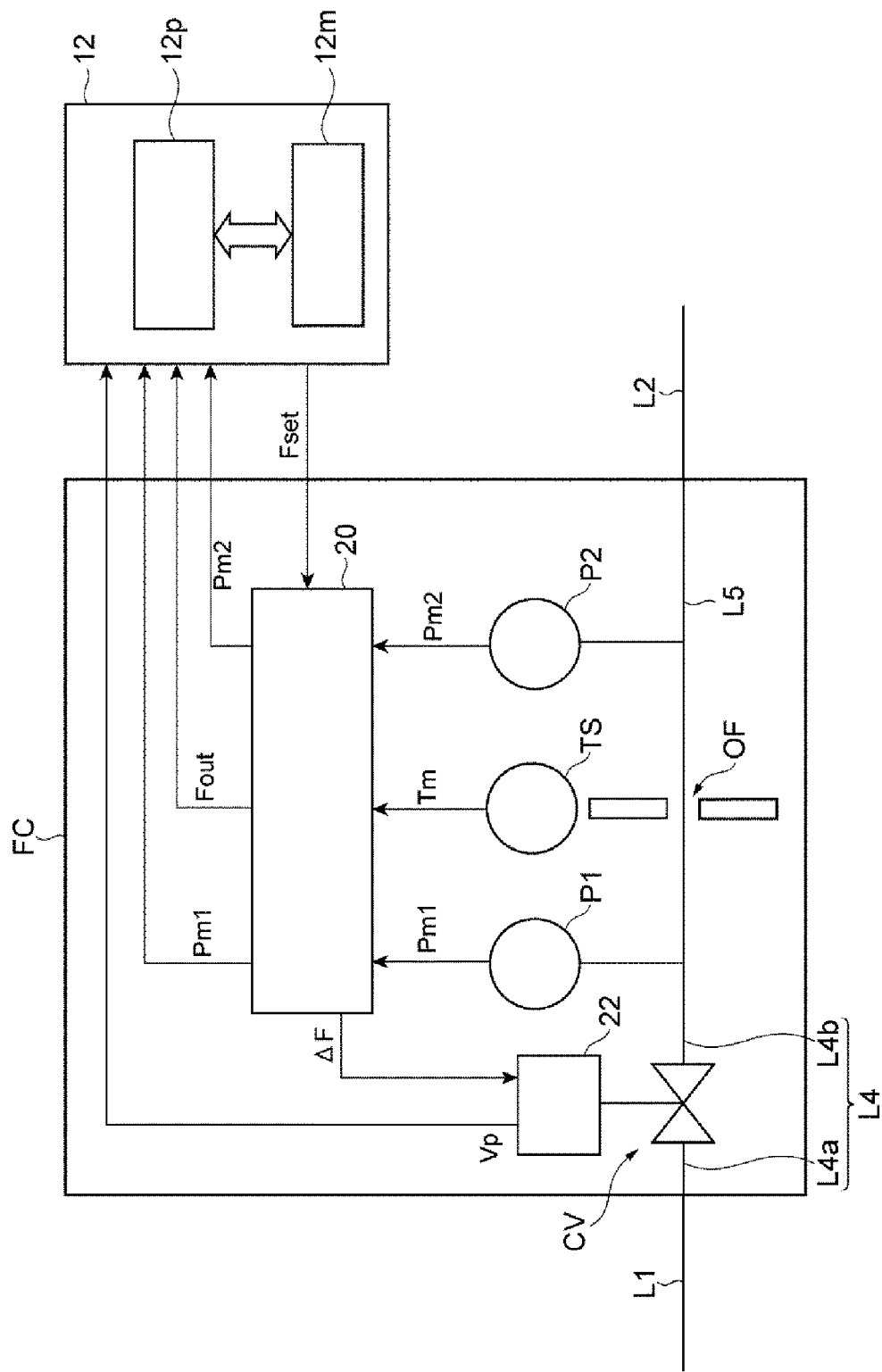
FIG. 2 is a diagram illustrating a flow rate controller and a control unit of the substrate processing apparatus.

Now, reference is made back to FIG. 1 and FIG. 2. FIG. 2 is a diagram illustrating a flow rate controller and a control unit of the substrate processing apparatus. As depicted in FIG. 1 and FIG. 2, the substrate processing apparatus 10 may further include the control unit 12. The control unit 12 may be implemented by a computer device including a processor 12p and a storage device 12m such as a memory.

The storage device 12m is configured to store therein programs for implementing various kinds of inspection processes according to exemplary embodiments to be described later and process recipes for substrate processing performed in the substrate processing apparatus 10. Further, the storage device 12m may also be configured to store therein multiple kinds of values sent from the gas supply system GP according to the exemplary embodiments to be described later.

The processor 12p is configured to be operated according to the programs stored in the storage device 12m, and control the individual components of the substrate processing apparatus 10 according to the process recipes. Further, the processor 12p is also configured to perform various kinds of inspection process according to the exemplary embodiments to be described later in response to the programs stored in the storage device 12m.

Now, referring to FIG. 2, a configuration of each of the multiple number of flow rate controllers FC will be explained. Each flow rate controller includes an orifice OF, a control valve CV, a first pressure gauge P1, a second pressure gauge P2, a fourth line L4, a fifth line L5 and a control circuit 20. The orifice OF is provided with an orifice hole between the fourth line L4 and the fifth line L5. The fourth line L4 is extended at the upstream side of the orifice OF, and the fifth line L5 is extended at the downstream side of the orifice OF. The fourth line L4 is connected to the corresponding first line L1. The control valve CV is provided at a portion of the fourth line L4. That is, the fourth line L4 includes an upstream portion L4a extended at the upstream side of the control valve CV and a downstream portion L4b extended at the downstream side of the control valve CV, and the control valve CV is provided between the upstream portion L4a and the downstream portion L4b. The first pressure gauge P1 is provided at a position at the upstream side of the orifice OF and at the downstream side of the control valve CV. The first pressure gauge P1 is configured to measure an internal pressure of the fourth line L4. The second pressure gauge P2 is provided at the downstream side of the orifice OF. The second pressure gauge P2 is configured to measure an internal pressure of the fifth line L5. The flow rate controller FC may further include a temperature measuring device TS. The temperature measuring device TS is configured to measure a temperature of a gas that passes through the orifice hole of the orifice OF.

A set flow rate Fset specified from the process recipe by the control unit 12 is inputted to the control circuit 20. A pressure measurement value Pm1 of the first pressure gauge P1 and a pressure measurement value Pm2 of the second pressure gauge P2 are inputted to the control circuit 20. Further, a temperature Tm measured by the temperature measuring device TS is also inputted to the control circuit 20.

The control circuit 20 calculates an output flow rate Fout of the flow rate controller FC by the following Expression (1) when a threshold condition is satisfied. By way of non-limiting example, the threshold condition may be met when the pressure measurement value Pm1 of the first pressure gauge P1 is equal to or larger than twice the pressure measurement value Pm2 of the second pressure gauge P2.

$$Fout = K \times Pm1 \tag{1}$$

In Expression (1), K is defined by $K=SC/Tm^{1/2}$. Here, S denotes a cross sectional area of the orifice hole of the orifice OF through which the gas passes, and C is a proportional coefficient.

Further, when the threshold condition is not satisfied, that is, when a non-threshold condition is satisfied, the control circuit 20 calculates an output flow rate Fout of the flow rate controller FC by the following Expression (2). The non-threshold condition is met when the pressure measurement value Pm1 of the first pressure gauge P1 is smaller than twice the pressure measurement value Pm2 of the second pressure gauge P2.

$$Fout = K \times Pm2^i \times (Pm1 - Pm2)^j \tag{2}$$

In Expression (2), i is a constant in the range of 0.40<i<0.50, and j is a constant in the range of 0.50<j<0.65. Both values are experimentally decided.

The control circuit 20 is configured to output a difference ΔF between the calculated output flow rate Fout and the set flow rate Fset to the control valve CV. Further, the control circuit 20 is also configured to output the pressure measurement value Pm1, the output flow rate Fout and the pressure measurement value Pm2 to the control unit 12 for various kinds of inspection processes according to the exemplary embodiments to be described later.

Figure 3:
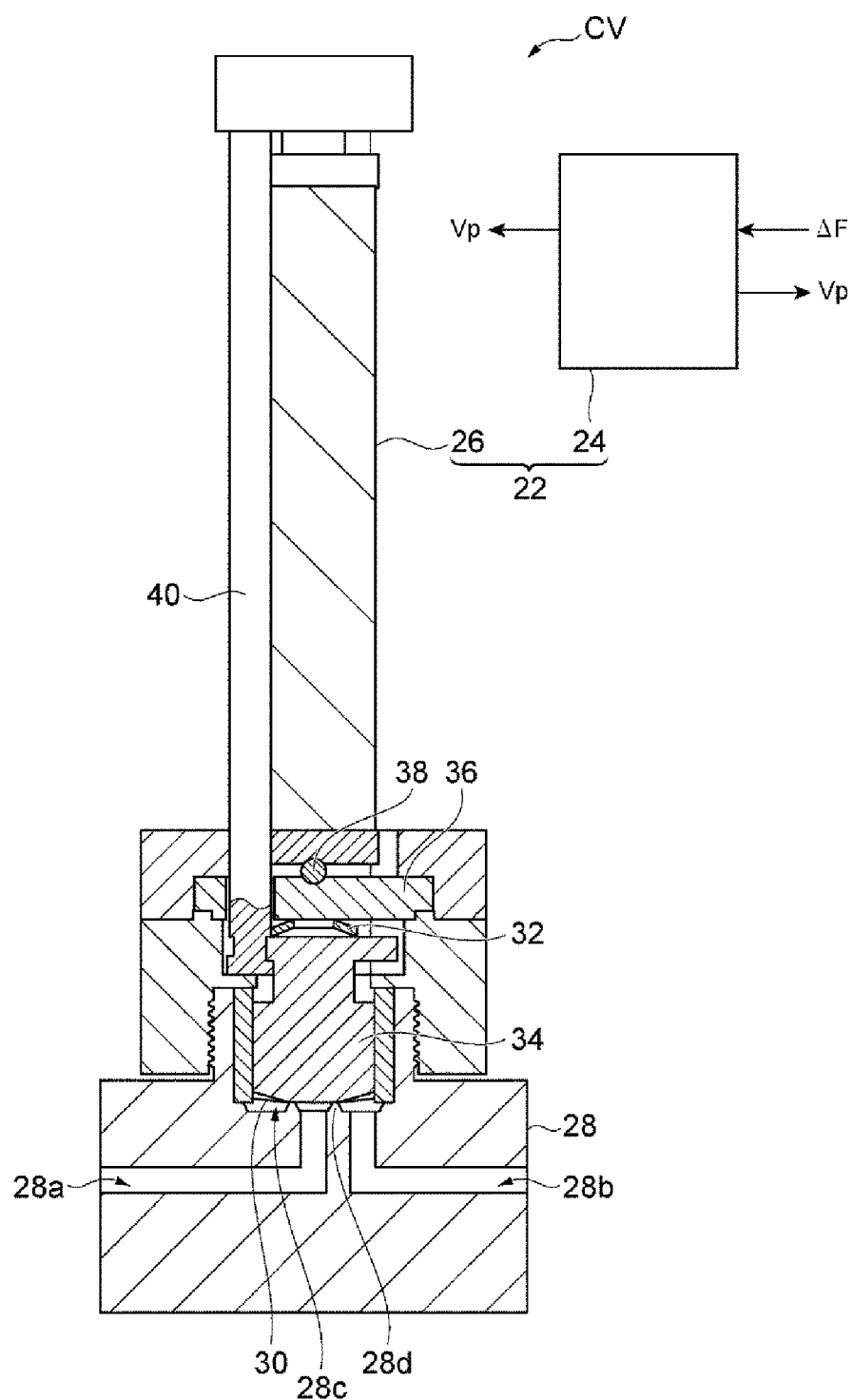
FIG. 3 is a diagram illustrating an example of a control valve.

FIG. 3 is a diagram illustrating the control valve. As depicted in FIG. 3, the control valve CV includes a driving unit 22. The driving unit 22 includes a control circuit 24. The value ΔF is inputted to the control circuit 24 from the control circuit 20.

Further, the driving unit 22 includes a piezoelectric element 26. The piezoelectric element 26 is configured to move a valve body 30 to be described later in opening/closing the control valve CV. The control circuit 24 is configured to control a voltage (application voltage) Vp applied to the piezoelectric element 26 such that the value ΔF becomes zero (0). Further, the control circuit 24 is also configured to input a signal specifying the application voltage Vp to the piezoelectric element 26 to the control unit 12.

The control valve CV further includes a main body 28, the valve body 30 (diaphragm), a belleville spring 32, a pressing member 34, a base member 36, a spherical body 38 and a supporting member 40. The main body 28 includes a flow path 28a, a flow path 28b and a valve chest 28c. The flow path 28a is extended between the upstream portion L4a of the fourth line L4 and the valve chest 28c. The flow path 28b is extended between the valve chest 28c and the downstream portion L4b of the fourth line L4. Further, the main body 28 further includes a valve sheet 28d.

The valve body 30 applies a force to the valve sheet 28d via the pressing member 34 by the belleville spring 32. When the application voltage to the piezoelectric element 26 is zero, the valve body 30 is in contact with the valve sheet 28d, so that the control valve CV is in a closed state.

One end (lower end in the figure) of the piezoelectric element 26 is supported by the base member 36. The piezoelectric element 26 is connected to the supporting member 40. One end (lower end in the figure) of the supporting member 40 is connected to the pressing member 34. If a voltage is applied to the piezoelectric element 26, the piezoelectric element 26 is extended. If the piezoelectric element 26 is extended, the supporting member 40 is moved away from the valve sheet 28d, and, accordingly, the pressing member 34 is also moved away from the valve sheet 28d. As a result, the valve body 30 is spaced apart from the valve sheet 28d, so that the control valve CV is opened. The opening degree of the control valve CV, i.e., the distance between the valve body 30 and the valve sheet 28d can be controlled by the voltage applied to the piezoelectric element 26.

Now, a method of inspecting the gas supply system according to an exemplary embodiment will be described. The method according to the exemplary embodiment includes several inspection processes for inspecting the gas supply system GP in a processing period during which a gas is supplied into the processing vessel PC of the substrate processing apparatus 10, that is, in a period during which a process is being performed; and several inspection processes for inspecting the gas supply system GP in a period except the processing period, that is, a period during which the process is not being performed. Below, these inspection processes will be explained in sequence.

Figure 4:
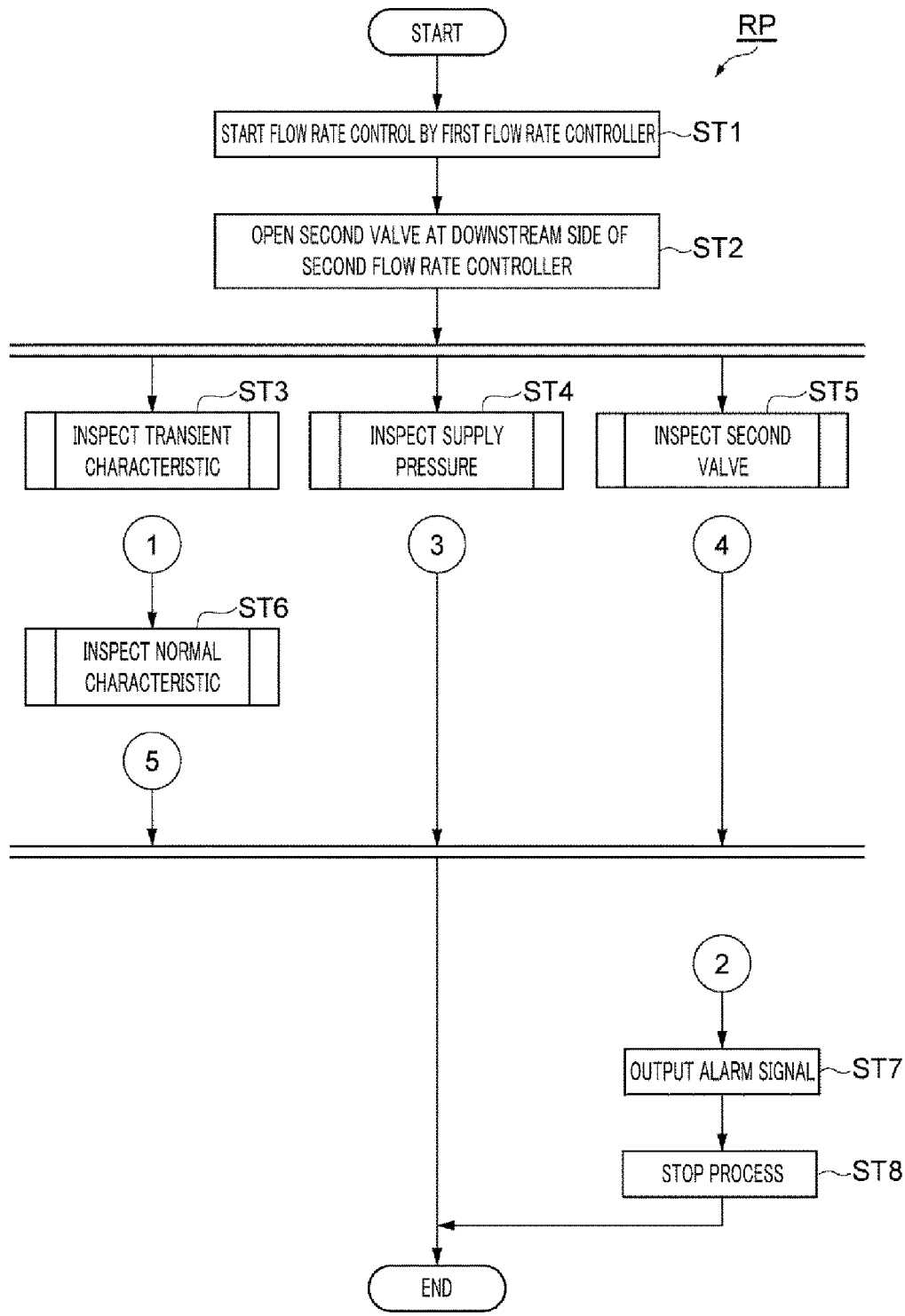
FIG. 4 is a flowchart for describing inspection processes in a method according to an exemplary embodiment.

FIG. 4 is a flowchart for describing inspection processes according to the exemplary embodiment. In FIG. 4, processes depicted between two double lines are performed in parallel. The inspection processes shown in FIG. 4 are processes (hereinafter, referred to as "real-time inspection process RP") that are performed in a period during which a process is being performed in the substrate processing apparatus and a gas is being supplied into the processing vessel via one or more first flow rate controllers among the multiple number of flow rate controllers. That is, the processes shown in FIG. 4 are the inspection processes performed in the processing period during which the one or more first flow rate controllers control the flow rates of the gases. Hereinafter, the real-time inspection process RP will be described for an example case where a process according to one process recipe is performed in the substrate processing apparatus; a first flow rate controller is the flow rate controller FC(1); and second flow rate controllers, which are not performing the flow rate control, that is, which are not supplying the gas into the processing vessel PC, are the flow rate controller FC(2) and the flow rate controller FC(3). Further, if different processes are performed in the substrate processing apparatus, the example of the one or more flow rate controllers used as the first flow rate controller and the example of the one or more flow rate controllers used as the second flow rate controller among the multiple number of flow rate controllers FC may be different from the examples mentioned above. Furthermore, the number of the first flow rate controllers and the number of the second flow rate controllers may not be particularly limited.

As depicted in FIG. 4, in the real-time inspection process RP, a process ST1 is first performed. In the process ST1, a control for a flow rate of a gas by the flow rate controller FC(1) is begun. The gas having the flow rate controlled by the flow rate controller FC(1) is supplied into the processing vessel PC. In the process ST1, among the first valves V1, a first valve V1(1) at the upstream side of the flow rate controller FC(1) is opened, and, among the second valves V2, a second valve V2(1) at the downstream side of the flow rate controller FC(1) is opened. Further, a third valve V3 is also opened, and the valve VP1, the valve VP2 and the valves VP3 are closed. The opening/closing operations of the valves in the process ST1 may be controlled in response to signals from the control unit 12. In addition, in the process ST1, a set flow rate Fset set based on the process recipe is inputted to the flow rate controller FC(1) from the control unit 12, and the flow rate controller FC(1) controls an opening degree of the control valve CV thereof to reduce the difference between the set flow rate Fset and the output flow rate Fout as stated above.

A process ST2 is begun substantially at the same time as the process ST1. In the process ST2, a second valve V2(2) at the downstream side of the flow rate controller FC(2) and a second valve V2(3) at the downstream side of the flow rate controller FC(3) are opened. The opening/closing of the valves in the process ST2 may be controlled in response to signals from the control unit 12. Further, the control valves CV of the flow rate controllers FC(2) and FC(3) may be opened or closed.

In the real-time inspection process RP, the output flow rate Fout of the flow rate controller FC(1) after the moment substantially the same as the beginning of the process ST2 and for a time period during which a process ST3 to a process ST6 are performed, that is, for a processing period is sent to the control unit 12 from the control circuit 20 of the flow rate controller FC(1). Further, the pressure measurement values Pm1 and Pm2 obtained by the first pressure gauge P1 and the second pressure gauge P2 of the flow rate controller FC(1) at multiple time points for the processing period are sent to the control unit 12 from the control circuit 20 of the flow rate controller FC(1); the pressure measurement values Pm1 and Pm2 obtained by the first pressure gauge P1 and the second pressure gauge P2 of the flow rate controller FC(2) at the multiple time points are sent to the control unit 12 from the control circuit 20 of the flow rate controller FC(2); the pressure measurement values Pm1 and Pm2 obtained by the first pressure gauge P1 and the second pressure gauge P2 of the flow rate controller FC(3) at the multiple time points are sent to the control unit 12 from the control circuit 20 of the flow rate controller FC(3). These pressure measurement values are stored in the storage device 12m of the control unit 12. Further, a signal specifying the application voltage Vp to the piezoelectric element 26 of the control valve CV of the flow rate controller FC(1) for the processing period is sent to the control unit 12 from the control circuit 24 of the control valve CV of the flow rate controller FC(1).

After the process ST2, the processes ST3, ST4 and ST5 are performed in parallel in the real-time inspection process RP. Further, a process ST6 is performed after the process ST3, and the process ST6 is performed in parallel with the process ST4 and the process ST5.

Figure 5:
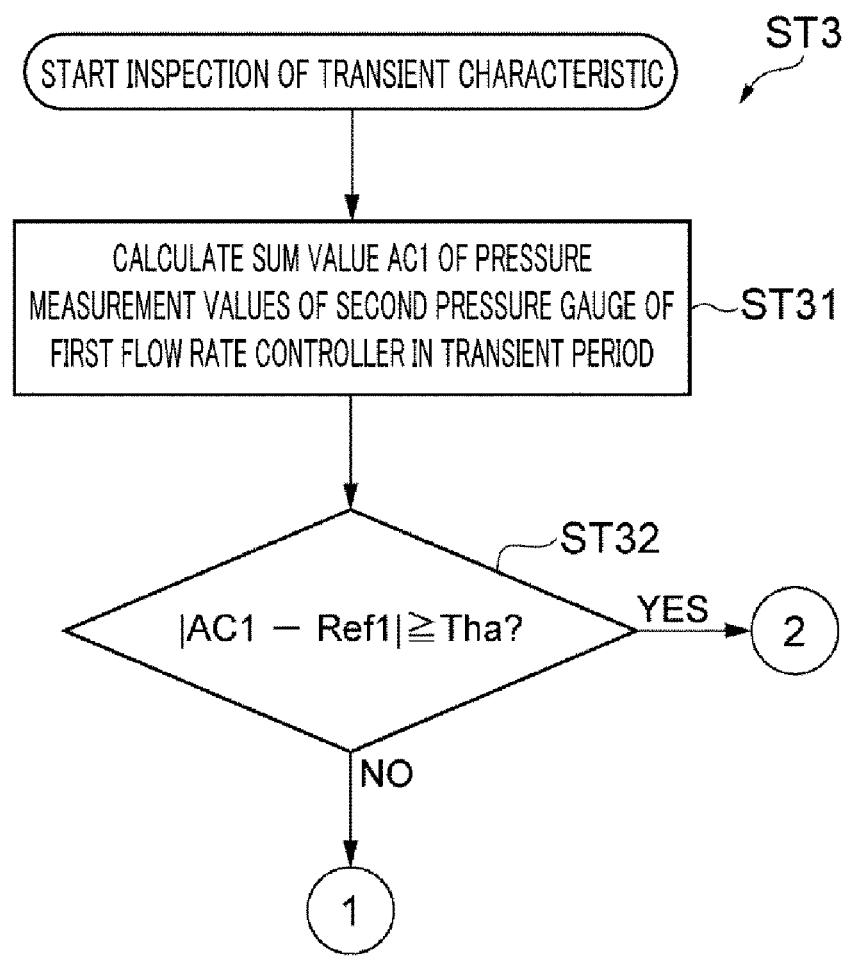
FIG. 5 is a flowchart for describing an example of a process ST3.

In the process ST3, a transient characteristic of the output flow rate of the gas which is output from the flow rate controller FC(1) is inspected. FIG. 5 is a flowchart for describing an example of the process ST3. The process ST3 in the example shown in FIG. 5 includes a process ST31 and a process ST32. Operations in the process ST31 and the process ST32 are performed by the control unit 12.

In the process ST31, there is calculated a sum value AC1 of a multiple number of the pressure measurement values Pm2 obtained by the second pressure gauge P2 of the flow rate controller FC(1) at multiple time points for a transient period within the processing period. The transient period is a time period prior to a steady period within the processing period. The steady period is a time period during which the output flow rate of the flow rate controller FC(1) is in a steady state. By way of example, when a difference between a maximum value and a minimum value of the output flow rate of the flow rate controller FC(1) is equal to or less than a preset value for a preset time period, it may be determined that the output flow rate of the flow rate controller FC(1) is in the steady state.

In the subsequent process ST32, the sum value AC1 is compared with a predetermined reference value Ref1. The predetermined reference value Ref1 is a sum value of the pressure measurement values Pm2 of the second pressure gauge P2 of the flow rate controller FC(1) at multiple time points for a transient period within a reference period. The reference period is a time period before the processing period and during which a process according to the same process recipe as the process recipe that is performed in the processing period is being performed in the substrate processing apparatus. Further, the reference period is also a time period during which the flow rate controller FC(1) controls the output flow rate thereof according to a set flow rate designated by the process recipe. By way of example, the reference period may be a time period in which the process according to the process recipe is performed in the substrate processing apparatus for the first time.

The pressure measurement values Pm2 of the second pressure gauge P2 of the flow rate controller FC(1) reflect the output flow rate of the flow rate controller FC(1). Thus, the sum value AC1 reflects the transient characteristic of the output flow rate of the flow rate controller FC(1) for the transient period within the processing period. By comparing the sum value AC1 with the reference value Ref1, it can be determined whether the transient characteristic of the output flow rate of the flow rate controller FC(1) in the processing period is changed from the transient characteristic of the output flow rate of the flow rate controller FC(1) in the reference period to an unallowable extent.

In the comparison of the process ST32, if an absolute value of a difference between the sum value AC1 and the predetermined reference value Ref1 is equal to or larger than a preset value Tha, it may be determined that the transient characteristic of the output flow rate of the flow rate controller FC(1) in the processing period is changed from the transient characteristic of the output flow rate of the flow rate controller FC(1) in the reference period to an unallowable extent. If it is determined that the transient characteristic of the output flow rate of the flow rate controller FC(1) in the processing period is changed from the transient characteristic of the output flow rate of the flow rate controller FC(1) in the reference period to the unallowable extent, an alarm signal is output by the control unit 12 in a process ST7. Further, at a subsequent process ST8, the current process is stopped by the control unit 12. Meanwhile, if it is determined in the process ST32 that the transient characteristic of the output flow rate of the flow rate controller FC(1) in the processing period is changed from the transient characteristic of the output flow rate of the flow rate controller FC(1) in the reference period only to an allowable extent, or that the transient characteristic of the output flow rate of the flow rate controller FC(1) in the processing period is the same as the transient characteristic of the output flow rate of the flow rate controller FC(1) in the reference period, the subsequent process ST6 is performed.

Further, in a period during which the process ST3 shown in FIG. 5 is performed, the second valve V2 at the downstream side of the flow rate controller FC(2) and the second valve V2 at the downstream side of the flow rate controller FC(3) may be closed or opened. In the latter case, that is, in case that the second valve V2 at the downstream side of the flow rate controller FC(2) and the second valve V2 at the downstream side of the flow rate controller FC(3) are opened, a longer transient period can be obtained, and it can be determined with higher precision whether the transient characteristic of the output flow rate of the flow rate controller FC(1) in the processing period is changed from the transient characteristic of the output flow rate of the flow rate controller FC(1) in the reference period.

Figure 6:
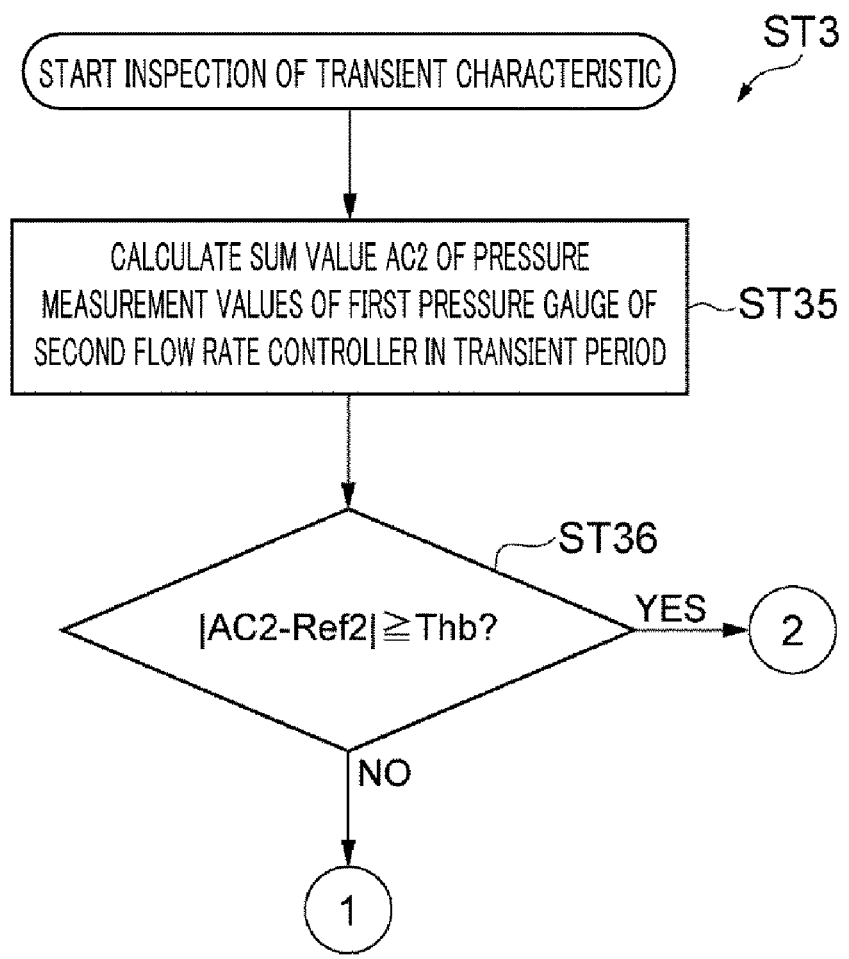
FIG. 6 is a flowchart for describing another example of the process ST3.

FIG. 6 is a flowchart for describing another example of the process ST3.

In a period during which the process ST3 of the example shown in FIG. 6 is performed, the second valve V2 at the downstream side of the flow rate controller FC(2) and the second valve V2 at the downstream side of the flow rate controller FC(3) are opened. The process ST3 in the example of FIG. 6 includes a process ST35 and a process ST36. Operations in the process ST35 and the process ST36 are performed by the control unit 12. In the process ST35, there is calculated a sum value AC2 of a multiple number of pressure measurement values Pm1 obtained by the first pressure gauge P1 of the flow rate controller FC(2) at multiple time points for the transient period within the processing period and a multiple number of pressure measurement values Pm1 obtained by the first pressure gauge P1 of the flow rate controller FC(3) at the multiple time points.

At the subsequent process ST36, the sum value AC2 is compared with a predetermined reference value Ref2. The predetermined reference value Ref2 is a sum value of pressure measurement values Pm1 obtained by the first pressure gauge P1 of the flow rate controller FC(2) at multiple time points for the transient period within the reference period and pressure measurement values Pm1 obtained by the first pressure gauge P1 of the flow rate controller FC(3) at the multiple time points.

In the processing period, the gas output from the flow rate controller FC(1) is supplied into the fourth line L4 and the fifth line L5 of the flow rate controller FC(2) and the fourth line L4 and the fifth line L5 of the flow rate controller FC(3). Accordingly, the pressure measurement values Pm1 of the first pressure gauge P1 of the flow rate controller FC(2) and the pressure measurement values Pm1 of the first pressure gauge P1 of the flow rate controller FC(3) reflect the output flow rate of the flow rate controller FC(1). Thus, the sum value AC2 reflects the transient characteristic of the output flow rate of the flow rate controller FC(1). By comparing the sum value AC2 with the predetermined reference value Ref2, it can be determined whether the transient characteristic of the output flow rate of the flow rate controller FC(1) in the processing period is changed from the transient characteristic of the output flow rate of the flow rate controller FC(1) in the reference period to an unallowable extent.

In the comparison of the process ST36, if an absolute value of a difference between the sum value AC2 and the predetermined reference value Ref2 is equal to or larger than a preset value Thb, it may be determined that the transient characteristic of the output flow rate of the flow rate controller FC(1) in the processing period is changed from the transient characteristic of the output flow rate of the flow rate controller FC(1) in the reference period to an unallowable extent. If it is determined that the transient characteristic of the output flow rate of the flow rate controller FC(1) in the processing period is changed from the transient characteristic of the output flow rate of the flow rate controller FC(1) in the reference period to the unallowable extent, an alarm signal is output by the control unit 12 in the process ST7. Further, at the subsequent process ST8, the current process is stopped by the control unit 12. Meanwhile, if it is determined in the process ST36 that the transient characteristic of the output flow rate of the flow rate controller FC(1) in the processing period is changed from the transient characteristic of the output flow rate of the flow rate controller FC(1) in the reference period only to an allowable extent, or that the transient characteristic of the output flow rate of the flow rate controller FC(1) in the processing period is the same as the transient characteristic of the output flow rate of the flow rate controller FC(1) in the reference period, the subsequent process ST6 is performed.

Furthermore, when calculating the sum value AC2, the pressure measurement values Pm1 of the first pressure gauge P1 of either one of the flow rate controller FC(2) and the flow rate controller FC(3) may be used. In this case, the predetermined reference value Ref2 is calculated by using the pressure measurement values Pm1 of the first pressure gauge P1 of either the flow rate controller FC(2) or the flow rate controller FC(3) for the transient period within the reference period. Further, a sum value of the pressure measurement values Pm1 of the first pressure gauge P1 of the flow rate controller FC(2) and a sum value of the pressure measurement values Pm1 of the first pressure gauge P1 of the flow rate controller FC(3) may be compared with their corresponding predetermined reference values individually.

Figure 7:
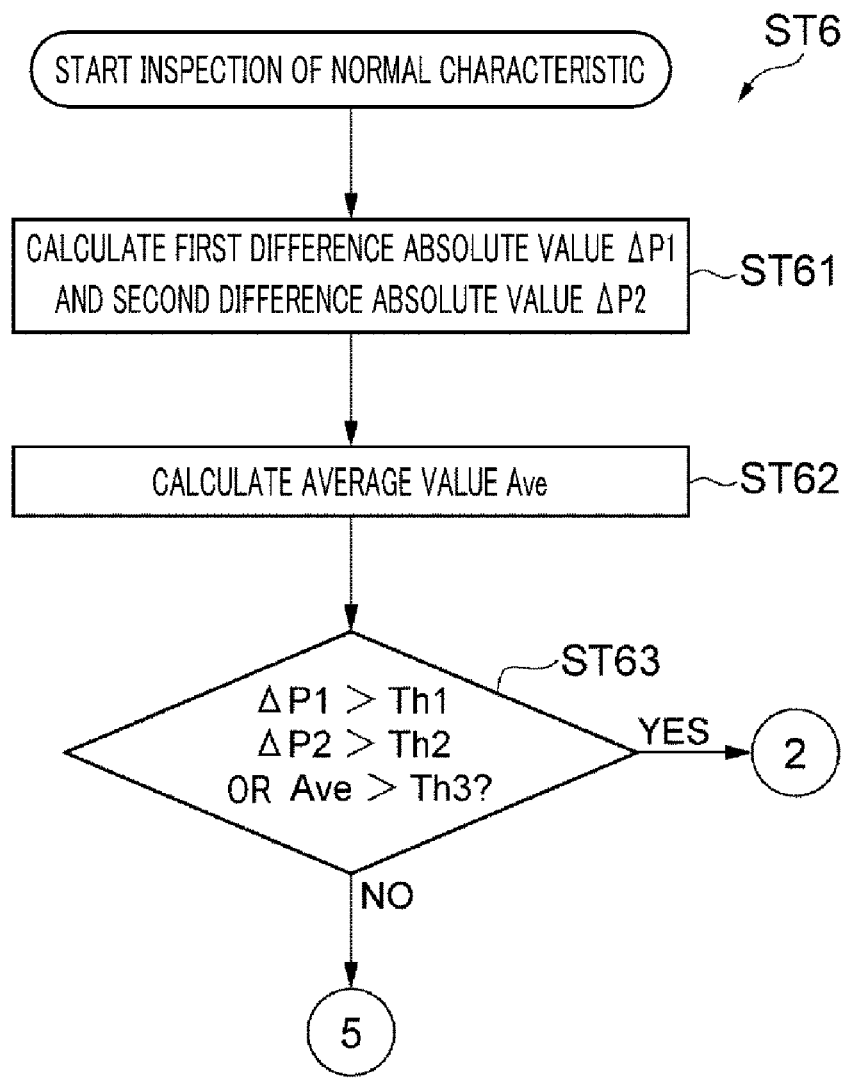
FIG. 7 is a flowchart for describing an example of a process ST6.

FIG. 7 is a flowchart for describing an example of the process ST6. In a period during which the process ST6 depicted in FIG. 7 is being performed, the second valve V2 at the downstream side of the flow rate controller FC(2) and the second valve V2 at the downstream side of the flow rate controller FC(3) are opened. The process ST6 includes a process ST61 to a process ST63. Operations in the process ST61 to the process ST63 can be performed by the control unit 12.

In the process ST61, a multiple number of first difference absolute values ΔP1 and a multiple number of second difference absolute values ΔP2 are calculated. To be specific, an absolute value (first difference absolute value ΔP1) of a difference between a first reference steady pressure value and a pressure measurement value Pm1 obtained by the first pressure gauge P1 of the flow rate controller FC(2) for the steady period within the processing period, i.e., a first steady pressure value is calculated. The first reference steady pressure value is determined prior to the processing period, and is a pressure measurement value obtained by the first pressure gauge P1 of the flow rate controller FC(2) for the steady period within the reference period. Further, an absolute value (second difference absolute value ΔP2) of a difference between a second reference steady pressure value and a pressure measurement value Pm2 obtained by the second pressure gauge P2 of the flow rate controller FC(2) for the steady period within the processing period, i.e., a second steady pressure value is calculated. The second reference steady pressure value is determined prior to the processing period, and is a pressure measurement value obtained by the second pressure gauge P2 of the flow rate controller FC(2) in the steady period within the reference period.

Furthermore, an absolute value (first difference absolute value ΔP1) of a difference between a first reference steady pressure value and a pressure measurement value Pm1 obtained by the first pressure gauge P1 of the flow rate controller FC(3) for the steady period within the processing period, i.e., a first steady pressure value is calculated. The first reference steady pressure value is determined prior to the processing period, and is a pressure measurement value measured by the first pressure gauge P1 of the flow rate controller FC(3) for the steady period within the reference period. Further, an absolute value (second difference absolute value ΔP2) of a difference between a second reference steady pressure value and a pressure measurement value Pm2 obtained by the second pressure gauge P2 of the flow rate controller FC(3) for the steady period within the processing period, i.e., a second steady pressure value is calculated. The second reference steady pressure value is determined prior to the processing period, and is a pressure measurement value measured by the second pressure gauge P2 of the flow rate controller FC(3) for the steady period within the reference period. Through these operations, the multiple number of first difference absolute values ΔP1 and the multiple number of second difference absolute values ΔP2 are calculated in the process ST61.

In the subsequent process ST62, an average value Ave of the first difference absolute values ΔP1 and the second difference absolute values ΔP2 is calculated. Then, in the subsequent process ST63, it is determined whether each of the first difference absolute values ΔP1 is larger than a preset first threshold value Th1, whether each of the second difference absolute valves ΔP2 is larger than a preset second threshold value Th2, or whether the average value Ave is larger than a preset third threshold value Th3.

If each of the first difference absolute values ΔP1 is larger than the preset first threshold value Th1, if each of the second difference absolute valves ΔP2 is larger than the preset second threshold value Th2, or if the average value Ave is larger than the preset third threshold value Th3, the process ST7 is performed subsequently. Meanwhile, if each of the first difference absolute values ΔP1 is equal to or smaller than the preset first threshold value Th1, if each of the second difference absolute valves ΔP2 is equal to or smaller than the preset second threshold value Th2 and the average value Ave is equal to or smaller than the preset third threshold value Th3, the real-time inspection process RP is ended. Further, the process ST6 may be performed repeatedly for the steady period within the processing period.

The gas output from the flow rate controller FC(1) at the flow rate according to the set flow rate during the processing period is supplied into the fourth line L4 and the fifth line L5 of each of the flow rate controllers FC(2) and FC(3) as well as into the processing vessel PC. Accordingly, the first steady pressure value and the second steady pressure value reflect the output flow rate of the flow rate controller FC(1) in the steady state. Further, the first reference steady pressure value is a first steady pressure value measured for the steady period within the reference period. Further, the second reference steady pressure value is a second steady pressure value measured for the steady period within the reference period. Accordingly, in the determination of the process ST63, it can be determined whether the output flow rate of the flow rate controller FC(1) in the steady state during the processing period is changed from the output flow rate of the flow rate controller FC(1) in the steady state during the reference period. Furthermore, even if a pressure change in the fourth line L4 and the fifth line L5 of each of one or more second flow rate controllers (e.g., the flow rate controllers FC(2) and FC(3)), which are not related to the flow rate control, is smaller than a pressure change that can be surely reflected on the pressure measurement values of the first pressure gauge P1 and the second pressure gauge P2 of the one or more second flow rate controllers, such a small pressure change is also reflected on the aforementioned average value. Regarding the reason for this, even if such a small pressure change is not reflected on a part of the pressure measurement values of the first pressure gauge P1 and the second pressure gauge P2 of the one or more second flow rate controllers, the small pressure change is reflected on another part thereof. That is, even such a small pressure change is reflected on the average value. Thus, by using the average value, it can be determined with high precision whether the output flow rate of the flow rate controller FC(1) in the steady state during the processing period is changed from the output flow rate of the flow rate controller FC(1) in the steady state during the reference period. Moreover, since the pressure measurement values of the first and second pressure gauges P1 and P2 of the second flow rate controllers, i.e., the flow rate controller FC(2) and the flow rate controller FC(3) are used, it can be detected with higher sensitivity whether the output flow rate of the flow rate controller FC(1) in the steady state during the processing period is changed from the output flow rate of the flow rate controller FC(1) in the steady state during the reference period. Additionally, in the process ST6, it may be also possible to use either one of the flow rate controller FC(2) and the flow rate controller FC(3) as the second flow rate controller.

Figure 8:
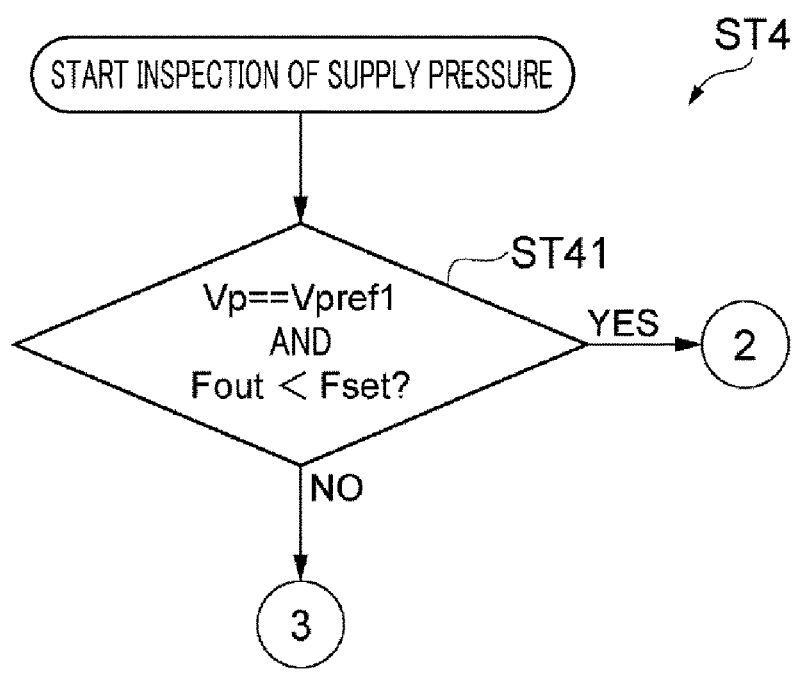
FIG. 8 is a flowchart for describing an example of a process ST4.

FIG. 8 is a flowchart for describing an example of the process ST4. As mentioned above, the process ST4 may be performed in parallel with the process ST3, the process ST5 and the process ST6. The process ST4 includes a process ST41. An operation of the process ST41 is performed by the control unit 12. In the process ST41, it is determined whether, in the processing period, the application voltage Vp to the piezoelectric element 26 of the control valve CV of the flow rate controller FC(1) is equal to a reference voltage Vpref1 and whether the output flow rate Fout of the flow rate controller FC(1) is smaller than the set flow rate Fset. The reference voltage Vpref1 is a voltage which is set previously as an application voltage to the piezoelectric element 26 for a case when the control valve CV of the flow rate controller FC(1) is fully opened.

In case that the output flow rate Fout of the flow rate controller FC(1) is smaller than the set flow rate Fset even if the voltage for fully opening the control valve CV is applied to the piezoelectric element 26, it is deemed that the pressure of the gas supplied to the flow rate controller FC(1) is smaller than required. For example, in such a case, it may be considered that there may be an operational defect of the first valve V1(1) at the upstream side of the flow rate controller FC(1). Through the process ST41, since it is determined whether the application voltage Vp to the piezoelectric element 26 of the control valve CV of the flow rate controller FC(1) is equal to the reference voltage Vpref1 and whether the output flow rate Fout of the flow rate controller FC(1) is smaller than the set flow rate Fset, it is possible to detect insufficiency of the supply pressure of the gas at the upstream side (primary side) of the flow rate controller FC(1).

In the process ST41, when the application voltage Vp is equal to the reference voltage Vpref1 and, also, when the output flow rate Fout of the flow rate controller FC(1) is smaller than the set flow rate Fset, it is determined that the pressure of the gas supplied to the flow rate controller FC(1) is insufficient. If it is determined that the pressure of the gas supplied to the flow rate controller FC(1) is insufficient, the process ST7 is subsequently performed. Meanwhile, if it is determined that the pressure of the gas supplied to the flow rate controller FC(1) is not insufficient, the process ST4 is finished. The process ST4 may be repeatedly performed during the processing period.

Figure 9:
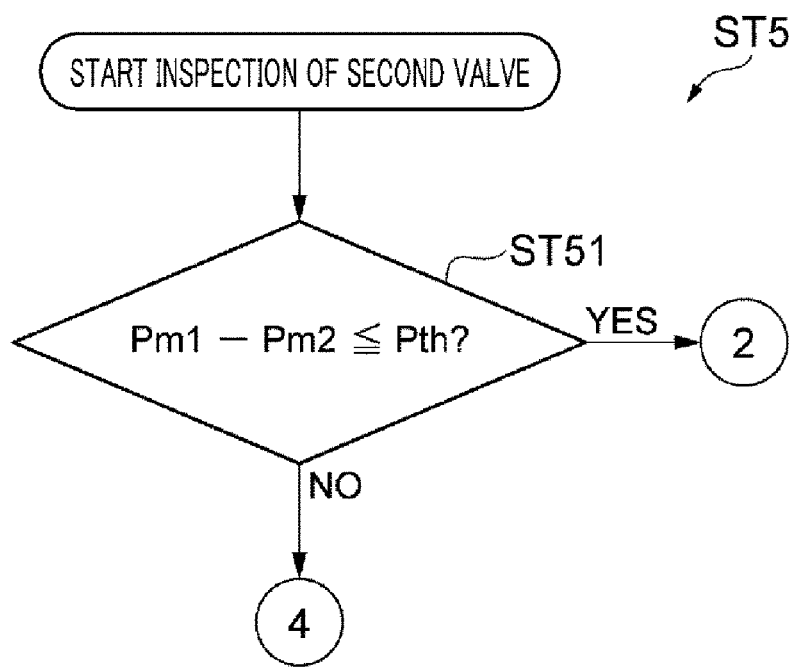
FIG. 9 is a flowchart for describing an example of a process ST5.

FIG. 9 is a flowchart for describing an example of the process ST5. As aforementioned, the process ST5 depicted in FIG. 9 may be performed in parallel with the process ST3, the process ST4 and the process ST6. The process ST5 shown in FIG. 9 includes a process ST51. An operation of the process ST51 is performed by the control unit 12. In the process ST51, it is determined whether a difference between the pressure measurement value Pm1 of the first pressure gauge P1 of the flow rate controller FC(1) and the pressure measurement value Pm2 of the second pressure gauge P2 of the flow rate controller FC(1) in the processing period is equal to or smaller than a preset value Pth. If the difference between the pressure measurement value Pm1 of the first pressure gauge P1 of the flow rate controller FC(1) and the pressure measurement value Pm2 of the second pressure gauge P2 of the flow rate controller FC(1) is equal to or smaller than the preset value Pth, the process ST7 is performed subsequently. Meanwhile, if the difference between the pressure measurement value Pm1 of the first pressure gauge P1 of the flow rate controller FC(1) and the pressure measurement value Pm2 of the second pressure gauge P2 of the flow rate controller FC(1) is larger than the preset value Pth, the process ST5 is ended. The process ST5 may be repeatedly performed during the processing period.

In case that the second valve V2(1) at the downstream side of the flow rate controller FC(1) is closed due to a breakdown thereof, the pressure measurement value Pm1 of the first pressure gauge P1 of the flow rate controller FC(1) and the pressure measurement value Pm2 of the second pressure gauge P2 of the flow rate controller FC(1) becomes substantially same. Accordingly, through the determination of the process ST51, it is possible to detect the breakdown of the second valve V2(1) at the downstream side of the flow rate controller FC(1).

Figure 10:
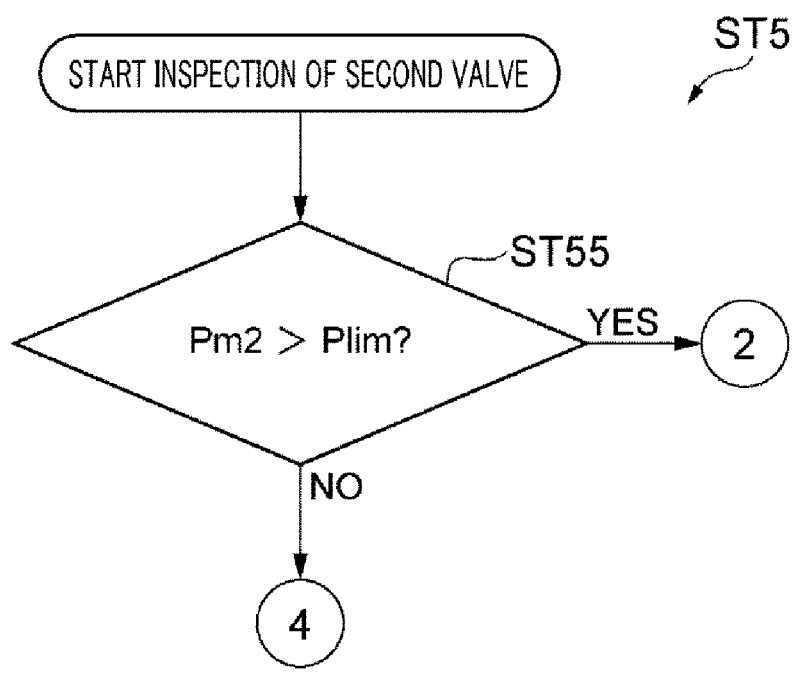
FIG. 10 is a flowchart for describing another example of the process ST5.

FIG. 10 is a flowchart for describing another example of the process ST5. As aforementioned, the process ST5 depicted in FIG. 10 may be performed in parallel with the process ST3, the process ST4 and the process ST6. The process ST5 shown in FIG. 10 includes a process ST55. An operation of the process ST55 is performed by the control unit 12. In the process ST55, it is determined whether the pressure measurement value Pm2 of the second pressure gauge P2 of the flow rate controller FC(1) during the processing period is larger than a preset upper limit pressure value Plim. If the pressure measurement value Pm2 of the second pressure gauge P2 of the flow rate controller FC(1) during the processing period is larger than the preset upper limit pressure value Plim, the process ST7 is subsequently performed. Meanwhile, if the pressure measurement value Pm2 of the second pressure gauge P2 of the flow rate controller FC(1) during the processing period is equal to or smaller than the preset upper limit pressure value Plim, the process ST5 is finished. This process ST5 may be repeatedly performed in the processing period.

Typically, an upper limit is set in the internal pressure of the fifth line L5 of the flow rate controller FC of the gas supply system GP. Accordingly, if the pressure measurement value Pm2 of the second pressure gauge P2 of the flow rate controller FC exceeds the preset upper limit pressure value Plim, it is deemed that the second valve V2(1) at the downstream side of the flow rate controller FC(1) is broken down. Thus, through the determination of the process ST55, it is possible to detect the breakdown of the second valve V2(1) at the downstream side of the flow rate controller FC(1).

Now, some inspection processes performed in a period other than the processing period in the method according to the exemplary embodiment will be explained with reference to FIG. 11 to FIG. 15. FIG. 11 to FIG. 15 provide flowcharts for describing some inspection processes of the method according to the exemplary embodiment.

Figure 11:
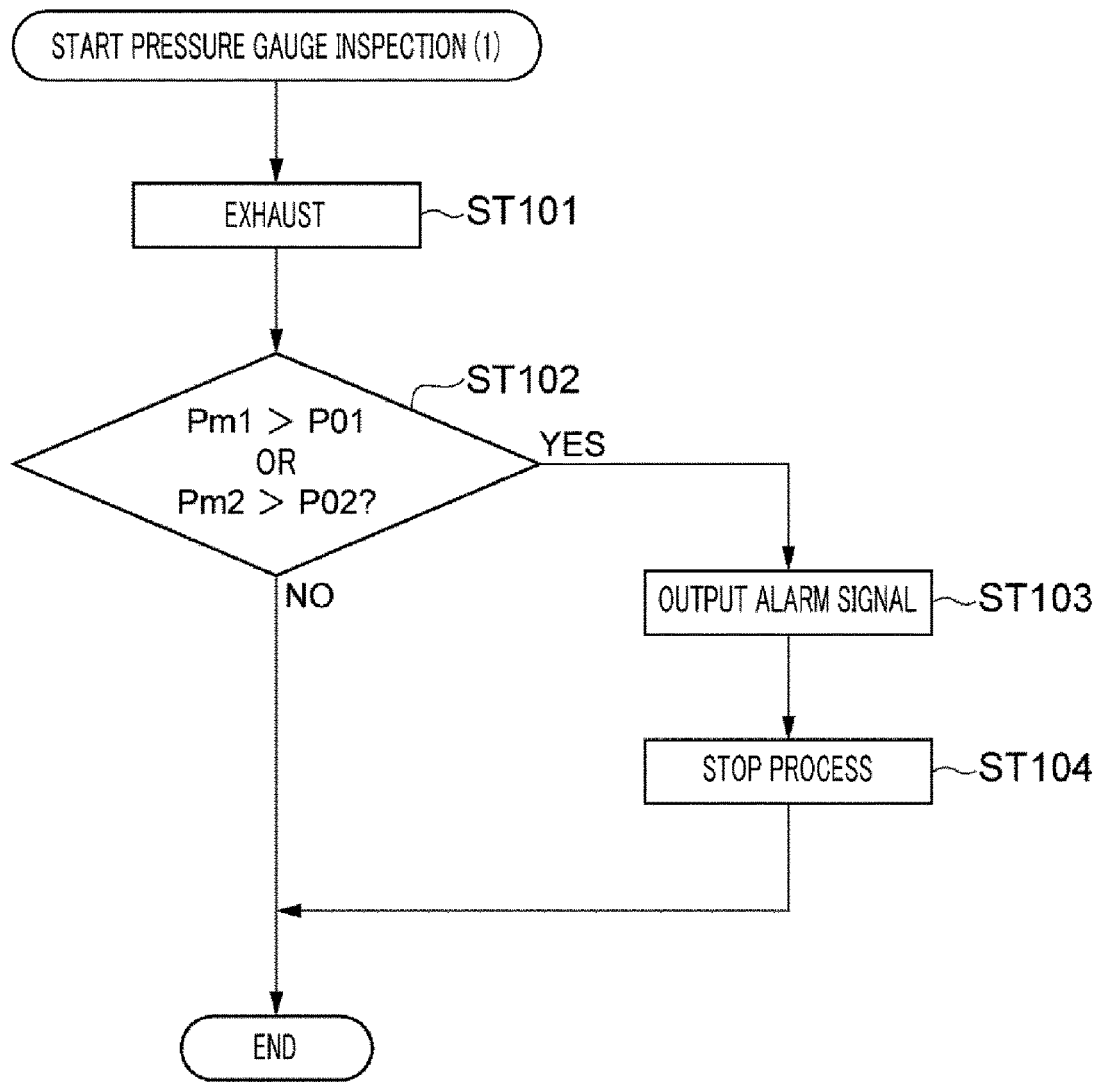
FIG. 11 is a flowchart for describing an inspection process in the method according to the exemplary embodiment.

An inspection process shown in FIG. 11 includes a process ST101 to a process ST104. The process ST101 and the process ST104 are performed under the control of the control unit 12. Further, the process ST102 and the process ST103 are performed by the control unit 12.

In the process ST101, the gas within the flow rate controllers FC is exhausted. To elaborate, the first valves V1 and the valve VP1 are closed, and the second valves V2, the control valves CV of the flow rate controllers FC, and the third valve V3 are opened. Further, the gas exhaust device EA is operated. Accordingly, the gas within the flow rate controllers FC is exhausted. In the process ST101, the valve VP2 and the valves VP3 may be opened.

At the subsequent process ST102, in the state that the gas within the flow rate controllers FC is exhausted, it is determined whether the pressure measurement value Pm1 of the first pressure gauge P1 of each flow rate controller FC is larger than a first preset value P01 or whether the pressure measurement value Pm2 of the second pressure gauge P2 of each flow rate controller FC is larger than a second preset value P02.

The first pressure gauge P1 and the second pressure gauge P2 of each flow rate controller FC are initially set to output a pressure measurement value of "0" in the state the gas within each flow rate controller FC is exhausted. That is, a zero-point adjustment is initially performed for the first pressure gauge P1 and the second pressure gauge P2 of each flow rate controller FC. Accordingly, in case that the pressure measurement value Pm1 is larger than the first preset value P01 in the state that the gas within the flow rate controllers FC is exhausted, an error of the zero-point of the first pressure gauge P1 of the corresponding flow rate controller FC can be detected. Furthermore, in case that the pressure measurement value Pm2 is larger than the second preset value P02 in the state that the gas within the flow rate controllers FC is exhausted, an error of the zero-point of the second pressure gauge P2 of the corresponding flow rate controller FC can be detected.

If it is determined in the process ST102 that the pressure measurement value Pm1 of the first pressure gauge P1 of any one of the flow rate controllers FC is larger than the first preset value P01 or that the pressure measurement value Pm2 of the second pressure gauge P2 of any one of the flow rate controllers FC is larger than the second preset value P02, an alarm signal is output in the subsequent process ST103. The process ST103 is the same process as the process ST7. At the subsequent process ST104, a process, which is to be performed subsequently, is stopped. Meanwhile, if the pressure measurement values Pm1 of the first pressure gauges P1 of all the flow rate controllers FC are equal to or smaller than the first preset value P01 and, also, if the pressure measurement values Pm2 of the second pressure gauges P2 of all the flow rate controllers FC is equal to or smaller than the second preset value P02, it is determined that there exists no error of the zero-point, and the inspection process shown in FIG. 11 is ended.

Figure 12:
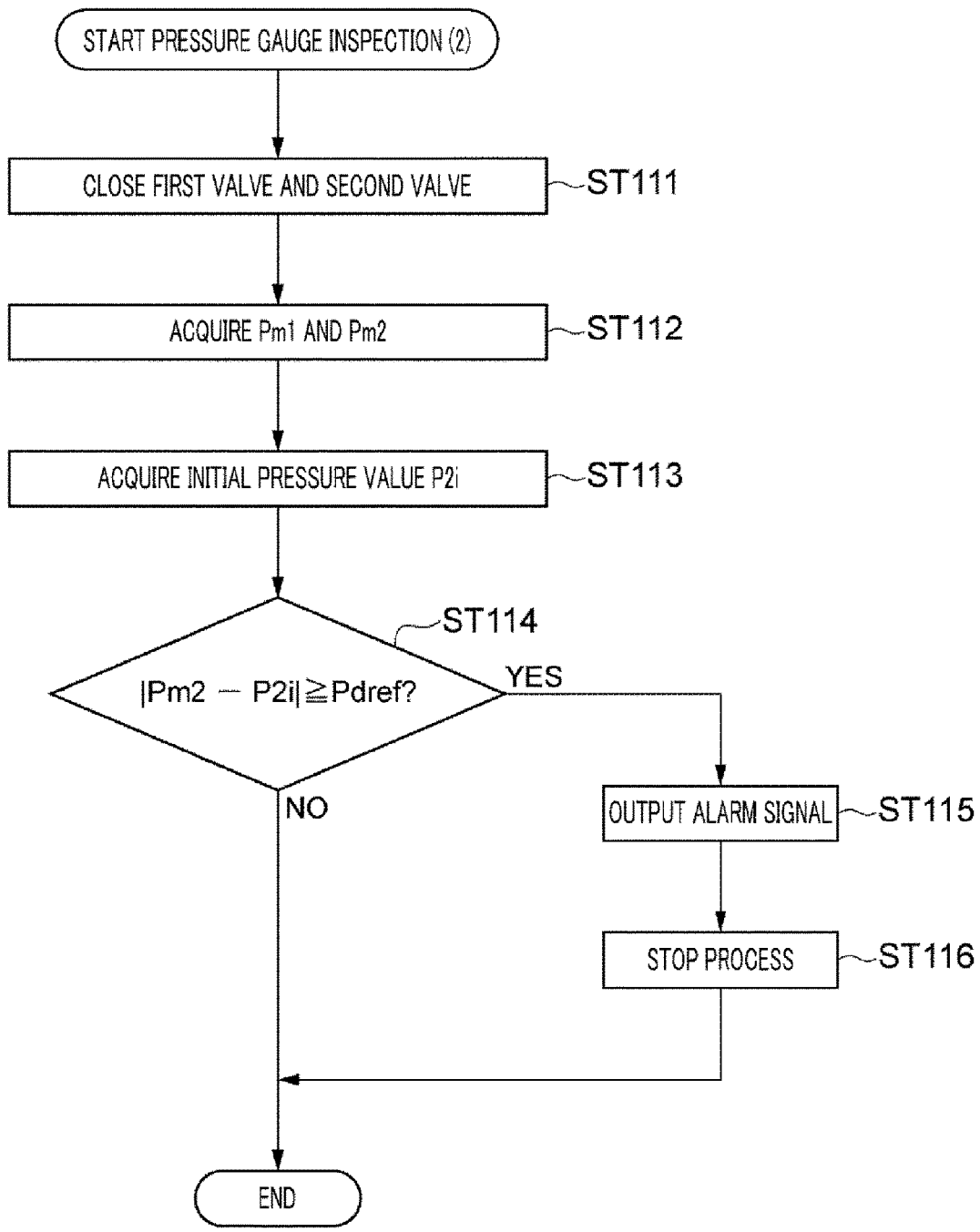
FIG. 12 is a flowchart for describing an inspection process in the method according to the exemplary embodiment.

An inspection process depicted in FIG. 12 is a process of inspecting whether there is a difference between the pressure measurement value of either one of the first pressure gauge P1 and the second pressure gauge P2 of each of the flow rate controllers FC and a corresponding initial pressure value. For example, this inspection process is performed when the gas supplied into each of the flow rate controllers FC is changed. The inspection process shown in FIG. 12 includes a process ST111 to a process ST116. The process ST111 and the process ST116 are performed under the control of the control unit 12. Further, the process ST112 to the process ST115 are performed by the control unit 12.

In the process ST111, the multiple number of first valves V1 and the multiple number of second valves V2 are closed. The process ST112 to the process ST116 are performed for each of the multiple number of flow rate controllers FC. Below, the processing contents of the process ST112 to the process ST116 for one flow rate controller FC will be explained.

In the process ST112, the pressure measurement value Pm1 of the first pressure gauge P1 of the flow rate controller FC and the pressure measurement value Pm2 of the second pressure gauge P2 of the flow rate controller FC are acquired. At the subsequent process ST113, an initial pressure value P2$i$ is obtained. The initial pressure value P2$i$ is a pressure value acquired by inputting the pressure measurement value Pm1, which is acquired in the process ST112, into a preset function. This function is created from multiple pressure measurement values Pm1, which are acquired in a period before the inspection process of FIG. 12 is performed, and multiple pressure measurement values Pm2 corresponding to the multiple pressure measurement values Pm1 respectively. The period before the inspection process is performed refers to an initial time period such as a period immediately after installation of a new flow rate controller FC or a period immediately after performing the adjustment of the first pressure gauge and the second pressure gauge of each flow rate controller FC. To be more specific, the first valve V1 at the upstream side of the flow rate controller FC and the second valve V2 at the downstream side of the flow rate controller FC are closed while setting an internal pressure of the flow rate controller FC to different pressures, and the pressure measurement values Pm1 of the first pressure gauge P1 of the flow rate controller FC and the pressure measurement values Pm2 of the second pressure gauge P2 of the flow rate controller FC are acquired for the different pressures. Then, by creating a relationship between the pressure measurement values Pm1 and the pressure measurement values Pm2 respectively corresponding to the pressure measurement values Pm1 which are obtained in this way, the preset function can be obtained. By way of example, this function may approximate the relationship between the pressure measurement values Pm1 and the pressure measurement values Pm2 respectively corresponding to the pressure measurement values Pm1.

In the subsequent process ST114, the pressure measurement value Pm2 is compared with the initial pressure value P2$i$. If the first pressure gauge P1 and the second pressure gauge P2 of the flow rate controller FC are in the normal state, the initial pressure value P2$i$ obtained by inputting the pressure measurement value Pm1 of the first pressure gauge P1 of the flow rate controller FC into the aforementioned preset function and the pressure measurement value Pm2 of the second pressure gauge P2 of the flow rate controller FC obtained in the process ST112 may be substantially same in the state that the first valve V1 at the upstream side of the flow rate controller FC and the second valve V2 at the downstream side of the flow rate controller FC are closed. Accordingly, through the comparison of the process ST114, it is possible to determine whether there is generated the difference between the pressure measurement value of either one of the first pressure gauge P1 and the second pressure gauge P2 of the flow rate controller FC and the initial pressure value.

In the process ST114, it is determined whether an absolute value of the difference between the pressure measurement value Pm2 acquired in the process ST112 and the initial pressure value P2$i$ is equal to or larger than a preset value Pdref. If the absolute value of the difference between the pressure measurement value Pm2 acquired in the process ST112 and the initial pressure value P2$i$ is equal to or larger than the preset value Pdref, the subsequent process ST115 is performed, and then, the process ST116 is performed. The process ST115 is the same as the process ST103, and the process ST116 is the same as the process ST104. Meanwhile, if the absolute value of the difference between the pressure measurement value Pm2 acquired in the process ST112 and the initial pressure value P2$i$ is smaller than the preset value Pdref, it is determined that the pressure measurement value of neither the first pressure gauge P1 nor the second pressure gauge P2 of the flow rate controller FC has an error with respect to the initial pressure value, and, thus, the inspection process of FIG. 12 is ended.

Figure 13:
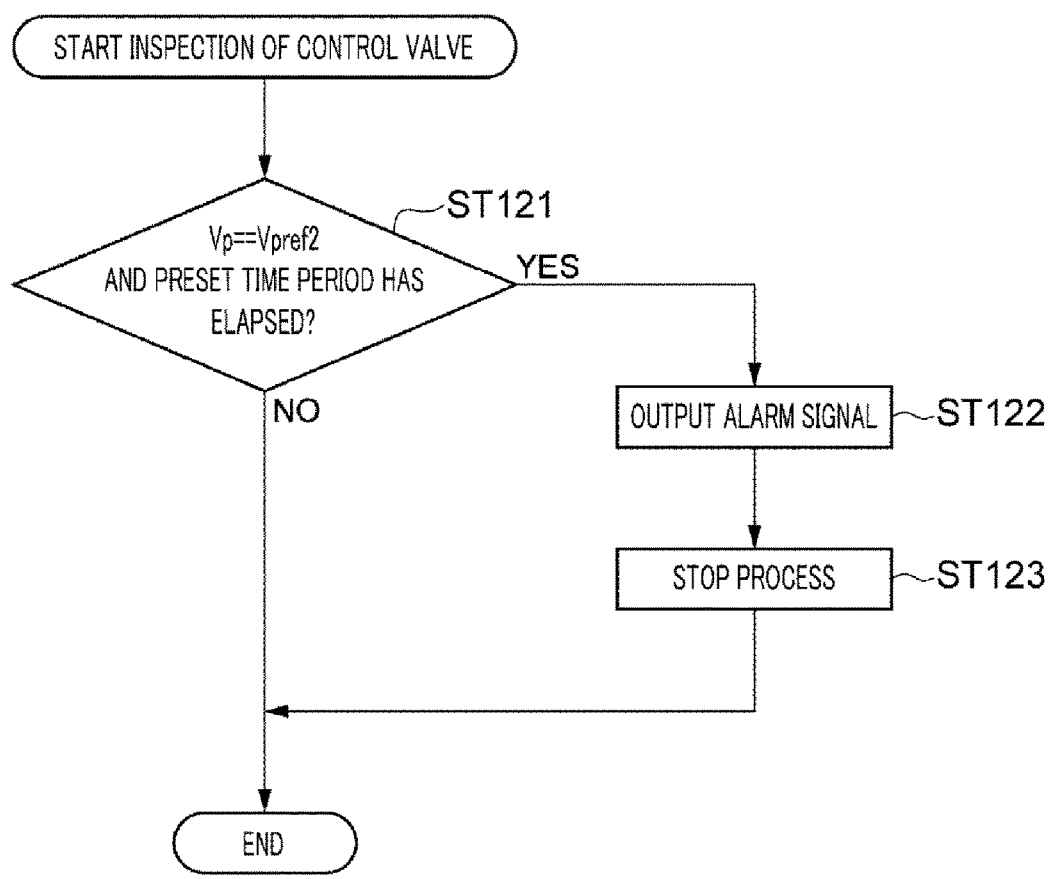
FIG. 13 is a flowchart for describing an inspection process in the method according to the exemplary embodiment.

An inspection process depicted in FIG. 13 is a process of detecting whether a leakage occurs in the control valve CV of each of the multiple number of flow rate controllers FC. This inspection process includes a process ST121 to a process ST123. The process ST123 is performed under the control of the control unit 12. Further, the process ST121 and the process ST122 are performed by the control unit 12. Below, the processing contents of the process ST121 to the process ST123 will be explained for one flow rate controller FC.

In the process ST121, it is determined whether a time period equal to or longer than a preset time period has elapsed in the state that the control valve CV of the flow rate controller FC is closed. It is determined that the control valve CV of the flow rate controller FC is closed when the application voltage Vp to the piezoelectric element 26 of the control valve CV of the flow rate controller FC is equal to a preset reference voltage Vpref2. The reference voltage Vpref2 is zero (0) in the control valve CV shown in FIG. 4.

Generally, it is difficult for the control valve to block the gas completely. If the closed state of the control valve CV lasts for a long time, it may affect the transient characteristic in a subsequent process of supplying the processing gas by opening the second valve V2 at the downstream side of the flow rate controller FC. Through the determination of the process ST121, the state of the control valve CV that affects the transient characteristic can be detected.

To elaborate, if it is determined in the process ST121 that the time period equal to or longer than the preset time period has elapsed in the state that the control valve CV of the flow rate controller FC is closed, the subsequent process ST122 is performed, and then, the process ST123 is performed. The process ST122 is the same as the process ST103, and the process ST123 is the same as the process ST104. Meanwhile, if it is determined in the process ST121 that the time period equal to or longer than the preset time period has not elapsed in the state that the control valve CV of the flow rate controller FC is closed, the inspection process of FIG. 13 is finished.

Figure 14:
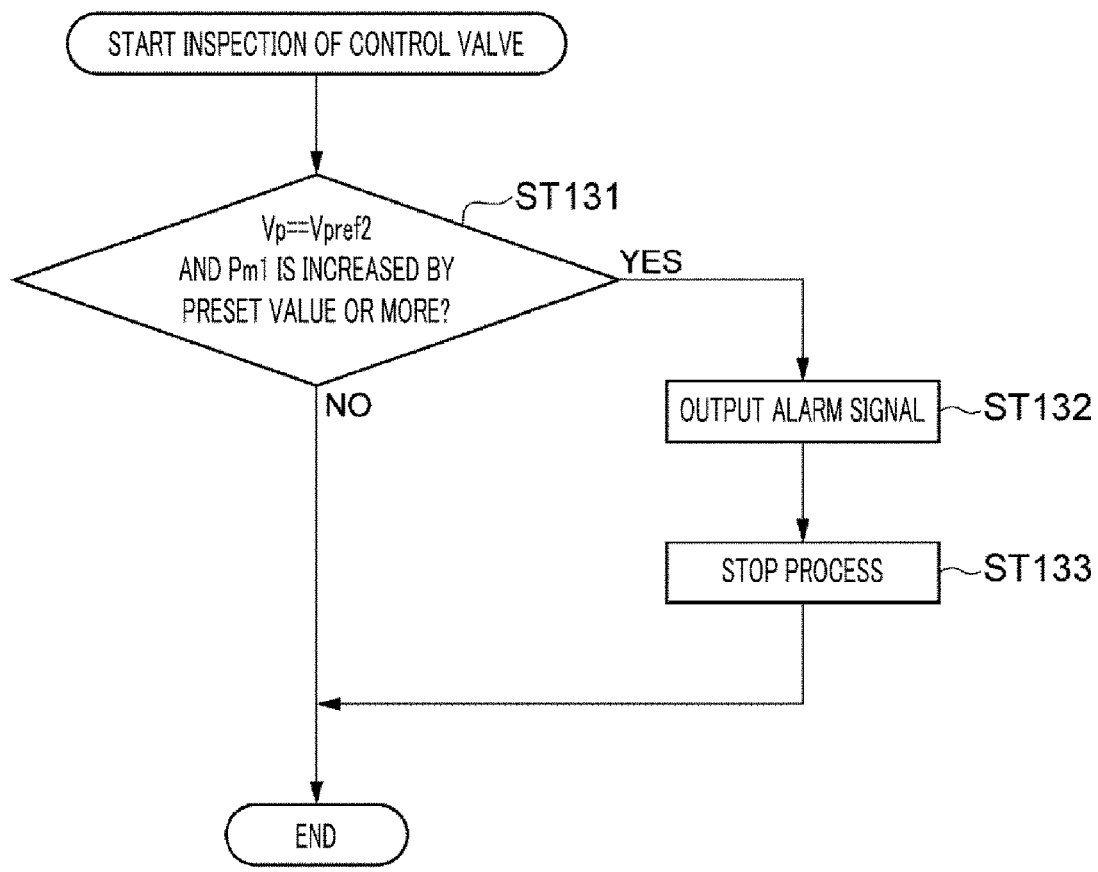
FIG. 14 is a flowchart for describing an inspection process in the method according to the exemplary embodiment.

An inspection process described in FIG. 14 is another process of detecting whether the leakage occurs in the control valve CV of each of the multiple number of flow rate controllers FC. This inspection process includes a process ST131 to a process ST133. The process ST133 is performed under the control of the control unit 12. Further, the process ST131 and the process ST132 are performed by the control unit 12. Below, the processing contents of the process ST131 to the process ST133 will be explained for one flow rate controller FC.

In the process ST131, it is determined whether the pressure measurement value Pm1 of the first pressure gauge P1 of the flow rate controller FC is increased by a preset value or more in the state that the control valve CV of the flow rate controller FC is closed. Further, it is determined that the control valve CV of the flow rate controller FC is closed when the application voltage Vp to the piezoelectric element 26 of the control valve CV of the flow rate controller FC is equal to the preset reference voltage Vpref2.

If the pressure measurement value Pm1 of the first pressure gauge P1 is increased by the preset value or more even though the application voltage Vp to the piezoelectric element 26 is set to close the control valve CV, it is deemed that an unallowable leakage occurs in the control valve CV. Through the determination of the process ST131, it is determined whether the pressure measurement value Pm1 of the first pressure gauge P1 of the flow rate controller FC is increased by the preset value or more when the application voltage Vp to the piezoelectric element 26 is set to close the control valve CV. Thus, it is possible to detect the unallowable leakage of the control valve.

To elaborate, if it is determined in the process ST131 that the pressure measurement value Pm1 of the first pressure gauge P1 of the flow rate controller FC is increased by the preset value or more in the state that the control valve CV of the flow rate controller FC is closed, the subsequent process ST132 is performed, and then, the process ST133 is performed. The process ST132 is the same as the process ST103, and the process ST133 is the same as the process ST104. Meanwhile, if it is determined in the process ST131 that the pressure measurement value Pm1 of the first pressure gauge P1 of the flow rate controller FC is not increased by the preset value or more in the state that the control valve CV of the flow rate controller FC is closed, the inspection process of FIG. 14 is ended.

Figure 15:
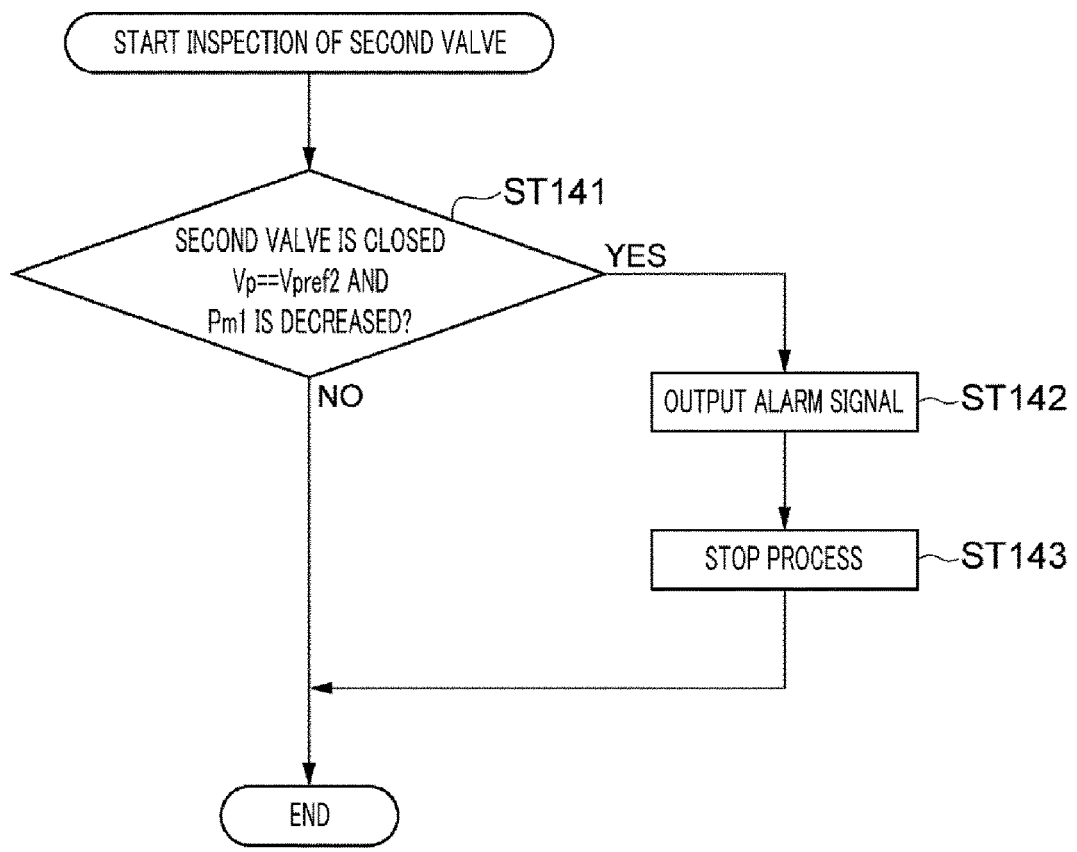
FIG. 15 is a flowchart for describing an inspection process in the method according to the exemplary embodiment.

An inspection process described in FIG. 15 is a process of detecting whether a leakage occurs in the multiple number of second valves V2. This inspection process includes a process ST141 to a process ST143. The process ST143 is performed under the control of the control unit 12. Further, the process ST141 and the process ST142 are performed by the control unit 12. Below, the inspection contents of the leakage detection will be explained for one second valve V2 at the downstream side of one flow rate controller FC.

In the process ST141, it is determined whether the pressure measurement value Pm1 of the first pressure gauge P1 of the flow rate controller FC is decreased in the state that the second valve V2 at the downstream side of the flow rate controller FC and the control valve CV of the flow rate controller FC are closed. Further, it is determined that the control valve CV of the flow rate controller FC is closed when the application voltage Vp to the piezoelectric element 26 of the control valve CV of the flow rate controller FC is equal to the preset reference voltage Vpref2.

If the pressure measurement value Pm1 of the first pressure gauge P1 of the flow rate controller FC is decreased even though the second valve V2 at the downstream side of the flow rate controller FC and the control valve CV of the flow rate controller FC are closed, it is deemed that the leakage occurs in the second valve V2 at the downstream side of the control valve CV. Through the process ST141, it is determined whether the pressure measurement value Pm1 of the first pressure gauge P1 of the flow rate controller FC is decreased when the second valve V2 at the downstream side of the flow rate controller FC and the control valve CV of the flow rate controller FC are closed. Thus, it is possible to detect the leakage of the second valve V2 at the downstream side of the flow rate controller FC.

To elaborate, if it is determined in the process ST141 that the pressure measurement value Pm1 of the first pressure gauge P1 of the flow rate controller FC is decreased in the state that the second valve V2 at the downstream side of the flow rate controller FC and the control valve CV of the flow rate controller FC are closed, the subsequent process ST142 is performed, and then, the process ST143 is performed. The process ST142 is the same as the process ST103, and the process ST143 is the same as the process ST104. Meanwhile, if it is determined in the process ST141 that the pressure measurement value Pm1 of the first pressure gauge P1 of the flow rate controller FC is not decreased in the state that the second valve V2 at the downstream side of the flow rate controller FC and the control valve CV of the flow rate controller FC are closed, the inspection process of FIG. 15 is finished.

Figure 16:
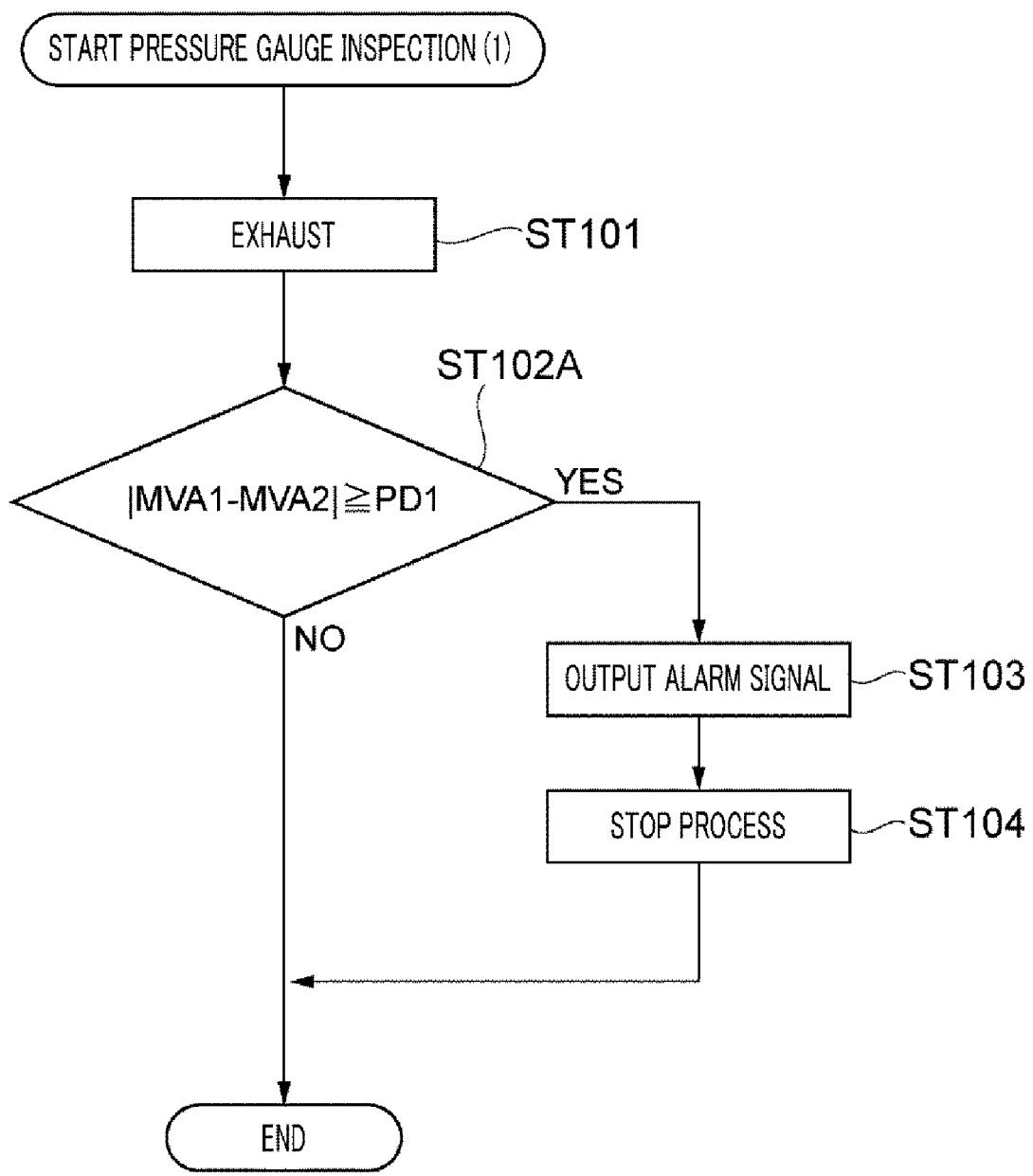
FIG. 16 is a flowchart for describing an inspection process in the method according to the exemplary embodiment.

Now, referring to FIG. 16, an inspection process that can be performed instead of the inspection process of FIG. 11 will be discussed. The inspection process shown in FIG. 16 includes, like the inspection process of FIG. 11, the process ST101, the process ST103 and the process ST104. Further, the inspection process of FIG. 16 further includes a process ST102A instead of the process ST102 in the inspection process of FIG. 11. The process ST101 and the process ST104 are performed under the control of the control unit 12. Further, the process ST102A and the process ST103 are performed by the control unit 12. Below, only the process ST102A will be explained.

In the process ST102A, it is determined whether a difference absolute value between a moving average value MVA1 of the pressure measurement values Pm1 obtained by the first pressure gauge P1 of each flow rate controller FC and a moving average value MVA2 of the pressure measurement values Pm2 obtained by the second pressure gauge P2 of each flow rate controller FC in a preset time period in the state that the gas within the flow rate controllers FC is exhausted is equal to or larger than a preset value PD1 (e.g., several kPa). If the condition of the process ST102A is satisfied in any one of the flow rate controllers FC, the subsequent process ST103 is performed. Meanwhile, if the condition of the process ST102A is not satisfied in any one of the flow rate controllers FC, the inspection process of FIG. 16 is ended. Here, the preset time period depends on an acquisition rate of the pressure measurement values Pm1 and the pressure measurement values Pm2. By way of example, when the acquisition rate is 100 μsec, the preset time period may be set within a range from 0.1 sec to 5 sec.

If there is no error in the zero-point in each of the flow rate controllers FC, substantially no difference may exist between the moving average value MVA1 and the moving average value MVA2 in the state that the gas within the flow rate controllers is exhausted. Accordingly, if the difference absolute value between the two moving average values is equal to or larger than the preset value PD1, it means that the corresponding flow rate controller has an error in the zero-point. Through the inspection process of FIG. 16, it is possible to detect the error in the zero-point of the flow rate controller.

Figure 17:
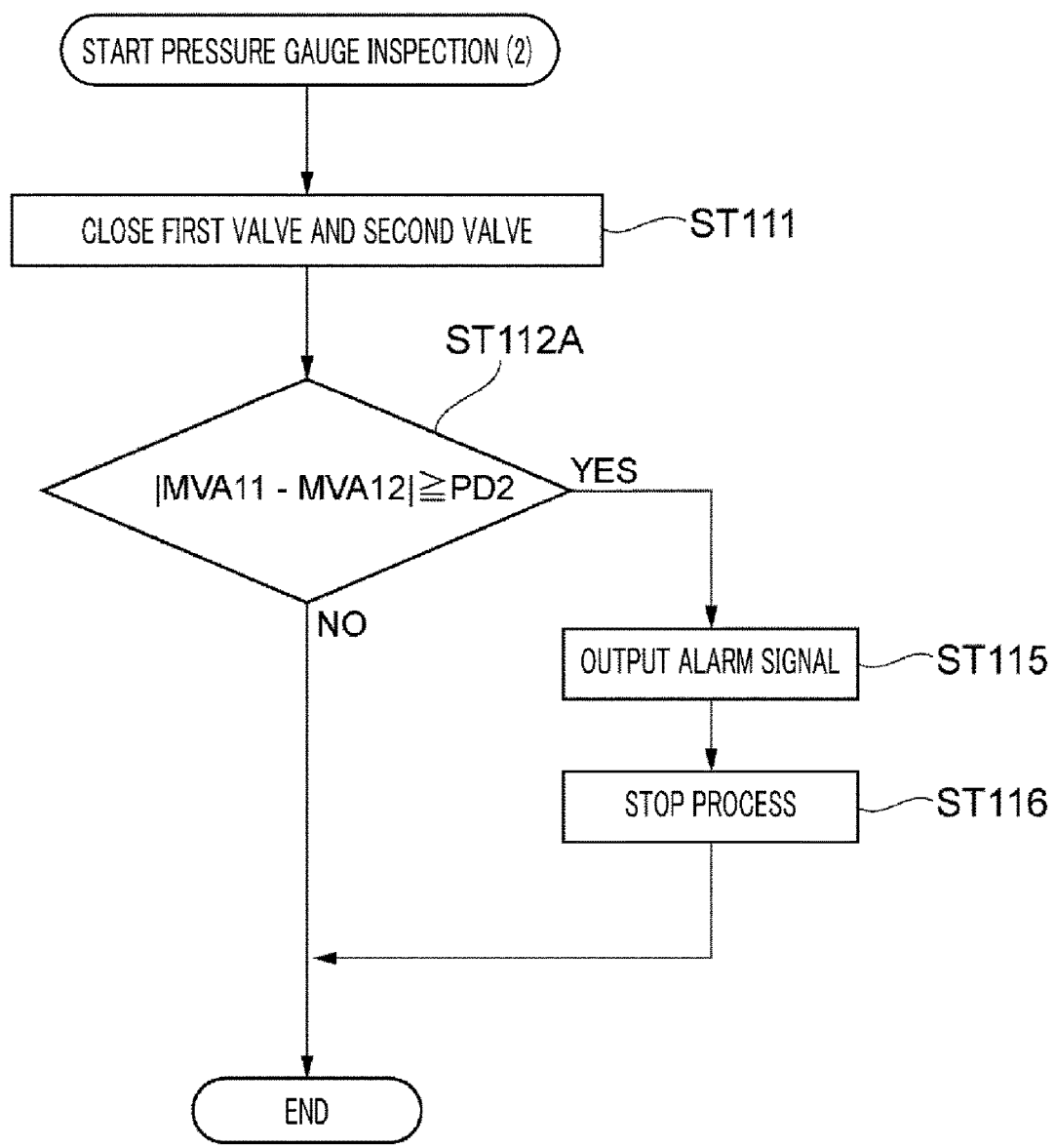
FIG. 17 is a flowchart for describing an inspection process in the method according to the exemplary embodiment.

Now, referring to FIG. 17, an inspection process that can be performed instead of the inspection process of FIG. 12 will be discussed. The inspection process shown in FIG. 17 includes, like the inspection process of FIG. 12, the process ST111, the process ST115 and the process ST116. The inspection process depicted in FIG. 17 further includes a process ST112A. The process ST111 and the process ST116 are performed under the control of the control unit 12. Further, the process ST112A and the process ST115 are performed by the control unit 12. Below, only the process ST112A will be explained.

The process ST112A is performed after the process ST111. In the process ST112A, it is determined whether a difference absolute value between a moving average value MVA11 of the pressure measurement values Pm1 obtained by the first pressure gauge P1 of each of the flow rate controllers FC and a moving average value MVA12 of the measurement values Pm2 obtained by the second pressure gauge P2 of each of the flow rate controller FC in a preset time period in the state that the multiple number of first valves V1 and the multiple number of second valves V2 are closed is equal to or larger than a preset value PD2 (e.g., several kPa). If the condition of the process ST112A is satisfied in any one of the flow rate controllers FC, the subsequent process ST115 is performed. Meanwhile, if the condition of the process ST112A is not satisfied in any one of the flow rate controllers FC, the inspection process of FIG. 17 is ended. Here, the preset time period depends on an acquisition rate of the pressure measurement values Pm1 and the pressure measurement values Pm2. By way of example, when the acquisition rate is 100 μsec, the preset time period may be set within a range from 0.1 sec to 5 sec.

In case that both the first pressure gauge P1 and the second pressure gauge P2 of each flow rate controller is in the normal state, substantially no difference may exist between the moving average value MVA11 and the moving average value MVA12 obtained for each flow rate controller in the state that the first valve V1 at the upstream side of the flow rate controller and the second valve V2 at the downstream side thereof are closed. Accordingly, if the difference absolute value between the two moving average values is equal to or larger than the preset value PD2, it means that either first pressure gauge P1 or the second pressure gauge P2 of the flow rate controller outputs a pressure measurement value having an error. Thus, through the inspection process of FIG. 17, it can be detected whether either one of the first pressure gauge P1 or the second pressure gauge P2 of each flow rate controller FC outputs a pressure measurement value having an error.

Figure 18:
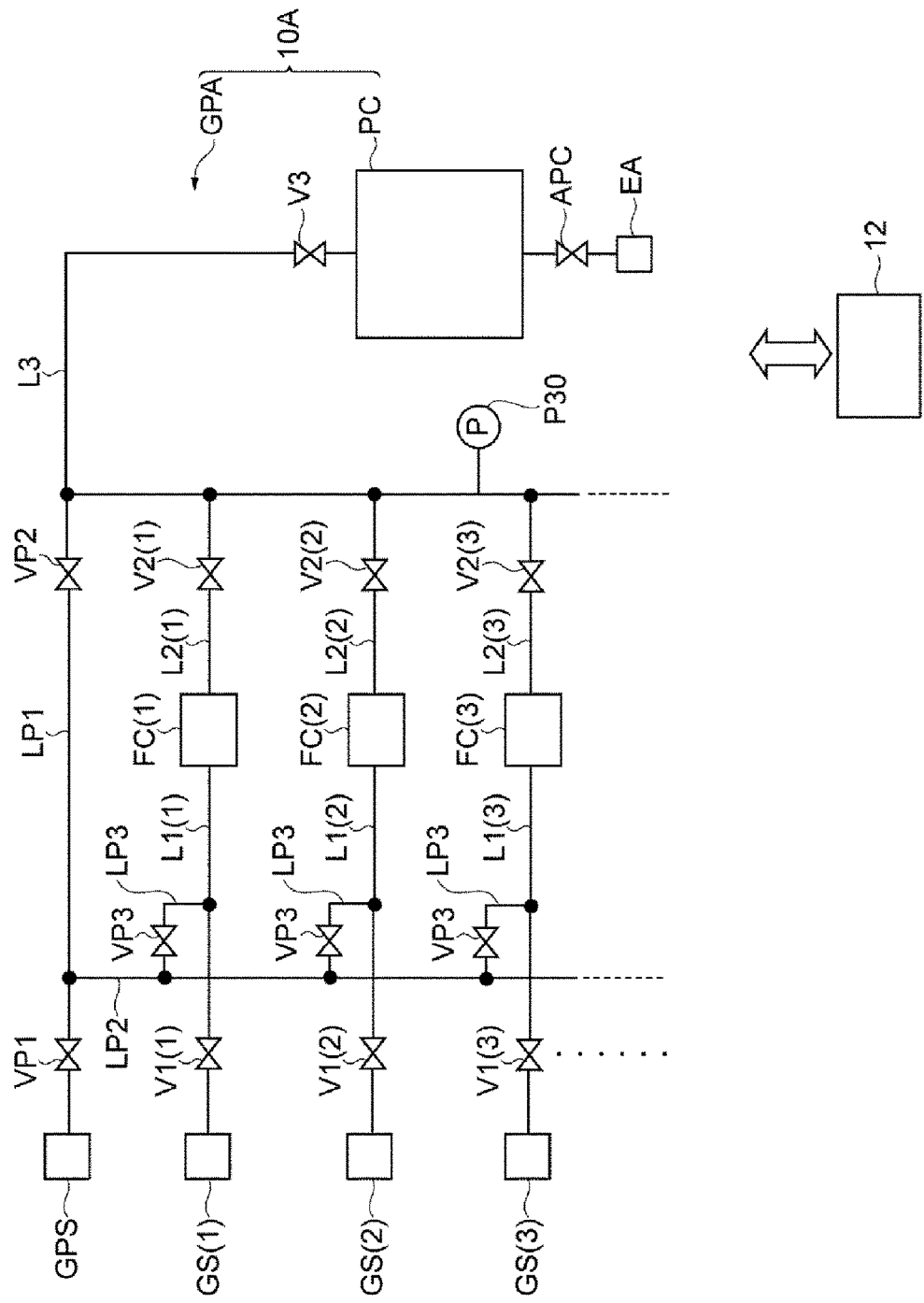
FIG. 18 is a diagram illustrating another example of the substrate processing apparatus.

Now, a real-time inspection process RP2 that can be used instead of the real-time inspection process RP shown in FIG. 4 will be explained. This real-time inspection process RP2 is applicable to a substrate processing apparatus shown in FIG. 18. The substrate processing apparatus 10A depicted in FIG. 18 is different from the substrate processing apparatus 10 shown in FIG. 1 in that it includes a gas supply system GPA further having a third pressure gauge P30. The third pressure gauge P30 is configured to measure an internal pressure of a third line L3. A pressure measurement value Pm3 of the third pressure gauge P30 is output to the control unit 12.

Figure 19:
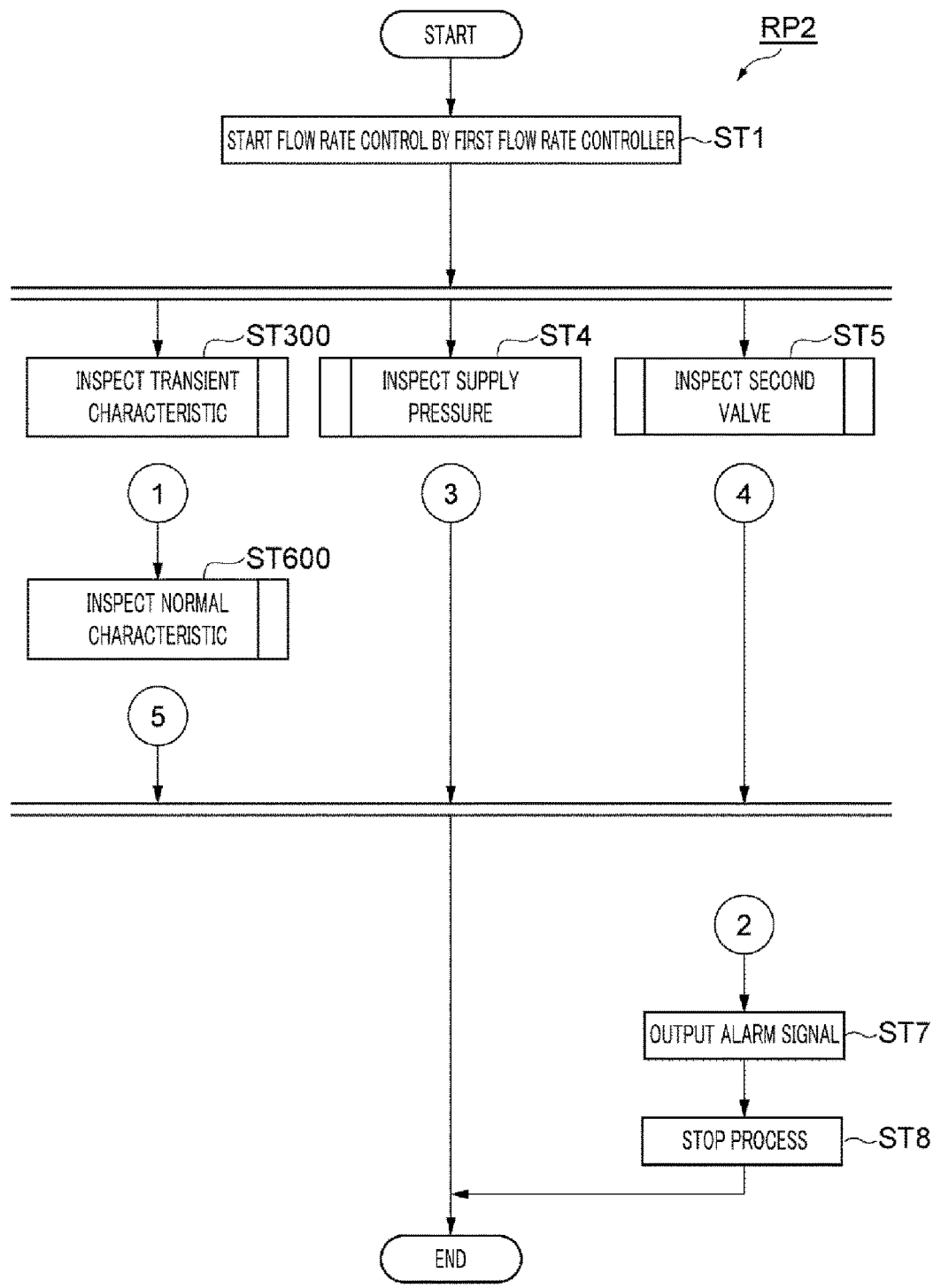
FIG. 19 is a flowchart for describing an inspection process in a method according to another exemplary embodiment.

The real-time inspection process RP2 is different from the real-time inspection process RP of FIG. 4 in that it does not include the process ST2 as shown in FIG. 19. The real-time inspection process RP2 includes a process ST300 instead of the process ST3 and a process ST600 instead of the process ST6. Except this, the real-time inspection process RP2 is the same as the real-time inspection process RP. Below, the process ST300 and the process ST600 will be discussed. The following description will be provided for an example case where a process according to a certain process recipe is performed in the substrate processing apparatus, and a first flow rate is the flow rate controller FC(1) and second flow rate controllers which do not perform the flow rate control, that is, which do not supply the gas into the processing vessel PC are the flow rate controller FC(2) and the flow rate controller FC(3).

Figure 20:
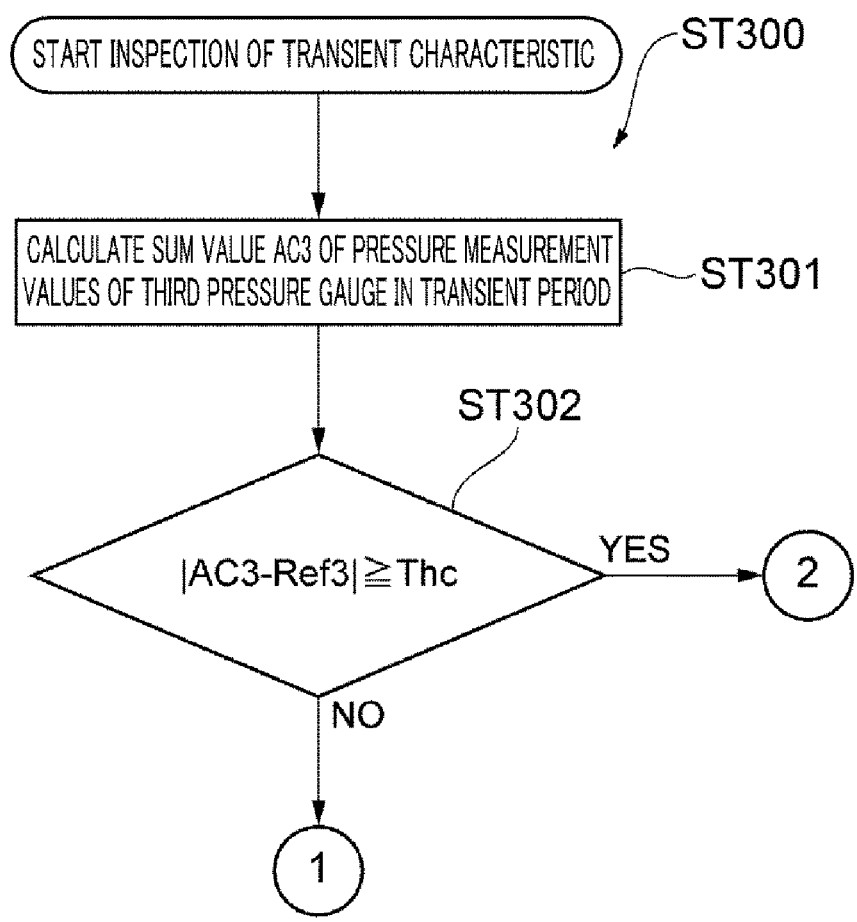
FIG. 20 is a flowchart for describing a process ST300.

FIG. 20 is a flowchart for describing the process ST300. As depicted in FIG. 20, the transient characteristic of the output flow rate of the gas output from the flow rate controller FC(1) is inspected in the process ST300. The process ST300 includes a process ST301 and a process ST302. Operations in the process ST301 and the process ST302 are performed by the control unit 12.

In the process ST301, there is calculated a sum value AC3 of the pressure measurement values Pm3 obtained by the third pressure gauge P30 at multiple time points for a transient period within a processing period during which the gas is supplied into the processing vessel PC of the substrate processing apparatus 10A via the flow rate controller FC(1). The transient period is a time period prior to a steady period within the processing period. The steady period is a time period during which the output flow rate of the flow rate controller FC(1) is in a steady state. By way of example, when a difference between a maximum value and a minimum value of the output flow rate of the flow rate controller FC(1) is equal to or less than a preset value for a preset time period, it may be determined that the output flow rate of the flow rate controller FC(1) is in the steady state.

In the subsequent process ST302, the sum value AC3 is compared with a predetermined reference value Ref3. The predetermined reference value Ref3 is a sum value of the pressure measurement values Pm3 of the third pressure gauge P30 at multiple time points for a transient period within a reference period. The reference period is a time period before the processing period and during which a process according to the same process recipe as the process recipe that is used in the processing period is being performed in the substrate processing apparatus. Further, the reference period is also a time period during which the flow rate controller FC(1) controls the output flow rate thereof according to a set flow rate designated by the process recipe. By way of example, the reference period may be a time period in which the process according to the process recipe is performed in the substrate processing apparatus for the first time.

The pressure measurement values Pm3 of the third pressure gauge P30 of the flow rate controller FC(1) reflect the output flow rate of the flow rate controller FC(1). Thus, the sum value AC3 reflects the transient characteristic of the output flow rate of the flow rate controller FC(1) during the processing period. By comparing the sum value AC3 with the set reference value Ref3, it can be determined whether the transient characteristic of the output flow rate of the flow rate controller FC(1) during the processing period is changed to an unallowable extent.

In the comparison of the process ST302, if an absolute value of a difference between the sum value AC3 and the set reference value Ref3 is equal to or larger than a preset value Thc, it may be determined that the transient characteristic of the output flow rate of the flow rate controller FC(1) during the processing period is changed from the transient characteristic of the output flow rate of the flow rate controller FC(1) during the reference period to an unallowable extent. If it is determined that the transient characteristic of the output flow rate of the flow rate controller FC(1) during the processing period is changed from the transient characteristic of the output flow rate of the flow rate controller FC(1) during the reference period to the unallowable extent, an alarm signal is output by the control unit 12 in the process ST7. Further, in the subsequent process ST8, the current process is stopped by the control unit 12. Meanwhile, if it is determined in the process ST302 that the transient characteristic of the output flow rate of the flow rate controller FC(1) during the processing period is changed from the transient characteristic of the output flow rate of the flow rate controller FC(1) during the reference period only to an allowable extent, or determined that the transient characteristic of the output flow rate of the flow rate controller FC(1) during the processing period is the same as the transient characteristic of the output flow rate of the flow rate controller FC(1) during the reference period, the subsequent process ST600 is performed.

Figure 21:
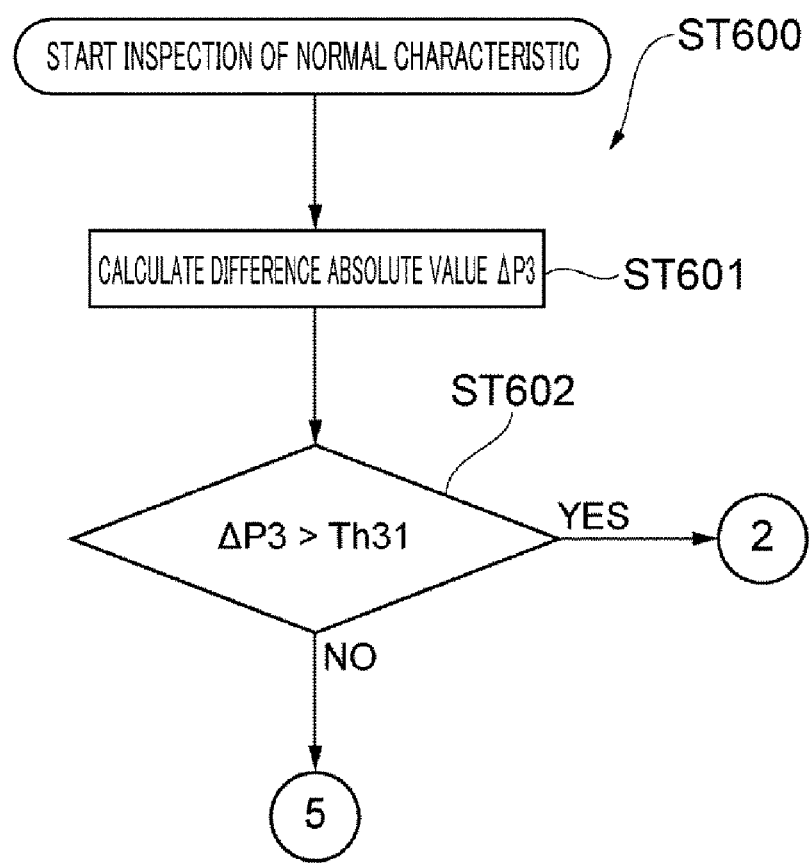
FIG. 21 is a flowchart for describing a process ST600.

FIG. 21 is a flowchart for describing the process ST600. The process ST600 includes a process ST601 and a process ST602. Operations in the process ST601 and the process ST602 may be performed by the control unit 12.

In the process ST601, a difference absolute value ΔP3 is calculated. To elaborate, the difference absolute value ΔP3 between the pressure measurement value Pm3 (steady pressure value) obtained by the third pressure gauge P30 for the steady period in the processing period and a reference steady pressure value. The reference steady pressure value is determined prior to the processing period, and is a pressure measurement value obtained by the third pressure gauge P30 for the steady period within the reference period.

In the subsequent process ST602, it is determined whether the difference absolute value ΔP3 is larger than a threshold value Th31. If the difference absolute value ΔP3 is larger than the threshold value Th31, the process ST7 is performed subsequently. Meanwhile, if the difference absolute value ΔP3 is equal to or less than the threshold value Th31, the real-time inspection process RP2 is ended. The process ST600 may be repeatedly performed for the steady period within the processing period.

The gas output from the flow rate controller FC(1) at a flow rate according to the set flow rate during the processing period is flown into the third line L3. Thus, the steady pressure value obtained by the third pressure gauge P30 reflects the output flow rate of the flow rate controller FC(1) in the steady state. Further, the reference steady pressure value is a steady pressure value obtained by the third pressure gauge P30 when the output flow rate of the flow rate controller FC(1), which outputs the gas in a period prior to the processing period, i.e., in the reference period according to the same set flow rate, is in the steady state. Thus, by determining whether the difference absolute value ΔP3 between the steady pressure value and the reference steady pressure value is larger than the threshold value Th31, it is possible to determine whether the output flow rate of the flow rate controller FC(1) in the steady state during the processing period is changed from the flow rate of the flow rate controller FC(1) in the steady state during the reference period.

In the above, the exemplary embodiments have been described. However, all of the above-described inspection processes need not be performed, and some of these inspection processes may be performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A method of inspecting a gas supply system configured to supply a gas into a processing vessel of a substrate processing apparatus,
wherein the gas supply system comprises:
multiple first lines respectively connected to multiple gas sources;
multiple first valves respectively provided at the first lines;
multiple flow rate controllers respectively provided at downstream sides of the first lines and respectively connected to the first lines;
multiple second lines respectively provided at downstream sides of the flow rate controllers and respectively connected to the flow rate controllers;
multiple second valves respectively provided at the second lines;
a third line provided at downstream sides of the second lines and connected to the second lines; and
a third valve provided at the third line,
wherein the third line is connected to the processing vessel at a downstream side thereof, and each of the flow rate controllers comprises an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line, and wherein the method comprises:

controlling a flow rate of the gas supplied into the processing vessel via a first flow rate controller among the flow rate controllers, the flow rate of the gas being controlled according to a set flow rate in the first flow rate controller;

opening, in a processing period during which the controlling of the flow rate of the gas is performed, one or more second valves, among the second valves, which are provided at downstream sides of one or more second flow rate controllers, among the flow rate controllers, which do not perform the controlling of the flow rate of the gas;

calculating one or more first difference absolute values and one or more second difference absolute values, each of the one or more first difference absolute values being a difference absolute value between a first reference steady pressure value and a first steady pressure value measured by the first pressure gauge of each of the one or more second flow rate controllers in a steady period during which an output flow rate of the first flow rate controller is in a steady state, each of the one or more second difference absolute values being a difference absolute value between a second reference steady pressure value and a second steady pressure value measured by the second pressure gauge of each of the one or more second flow rate controllers in the steady period, each of the first reference steady pressure value and the second reference steady pressure value being set prior to the processing period, and the first reference steady pressure value and the second reference steady pressure value being pressure measurement values measured by the first pressure gauge and the second pressure gauge of each of the one or more second flow rate controllers, respectively, when the output flow rate of the first flow rate controller, through which the flow rate of the gas supplied into the processing vessel is controlled according to the set flow rate, is in the steady state, wherein the first reference steady pressure value and the second reference steady pressure value are pressure measurement values obtained by the second flow rate controller in a steady state during a reference period prior to the processing period;

calculating an average value of the one or more first difference absolute values and the one or more second difference absolute values; and determining whether the output flow rate of the first flow rate controller in the steady state during the processing period is changed from the output flow rate of the first flow rate controller in the steady state during the reference period by determining whether each of the one or more first difference absolute values is larger than a first threshold value, whether each of the one or more second difference absolute values is larger than a second threshold value, or whether the average value is large than a third threshold value.

2. The method of claim 1, wherein the one or more second flow rate controllers are multiple second flow rate controllers, among the flow rate controllers, which do not perform the controlling of the flow rate of the gas in the processing period, the one or more first difference absolute values are multiple first difference absolute values obtained by calculating the difference absolute value between the first reference steady pressure value and the first steady pressure value measured by the first pressure gauge of each of the multiple second flow rate controllers in the steady period, and the one or more second difference absolute values are multiple second difference absolute values obtained by calculating the difference absolute value between the second reference steady pressure value and the second steady pressure value measured by the second pressure gauge of each of the multiple second flow rate controller in the steady period, the average value is an average value of the multiple first difference absolute values and the multiple second difference absolute values, and in the determining, it is determined whether each of the multiple first difference absolute values is larger than the first threshold value, whether each of the multiple second difference absolute values is larger than the second threshold value, or whether the average value is larger than the third threshold value.

3. The method of claim 1, further comprising:

calculating a sum value of pressure measurement values of the second pressure gauge of the first flow rate controller at multiple time points for a transient period prior to the steady period within the processing period; and comparing the sum value with a preset reference value.

4. The method of claim 1, further comprising:

calculating a sum value of pressure measurement values of the first pressure gauge of the one or more second flow rate controllers at multiple time points for a transient period prior to the steady period within the processing period; and comparing the sum value with a preset reference value.

5. The method of claim 1, further comprising:

determining whether a difference between a pressure measurement value of the first pressure gauge of the first flow rate controller in the processing period and a pressure measurement value of the second pressure gauge of the first flow rate controller in the processing period is equal to or smaller than a preset value.

6. The method of claim 1, further comprising:

determining whether, in a state that the gas within the flow rate controllers is exhausted, a pressure measurement value of the first pressure gauge of each of the flow rate controllers is larger than a first preset value or a pressure measurement value of the second pressure gauge of each of the flow rate controllers is larger than a second preset value.

7. The method of claim 1, further comprising:

determining whether, in a state that the gas within the flow rate controllers is exhausted, a difference absolute value between a moving average value of pressure measurement values measured by the first pressure gauge of each of the flow rate controllers and a moving average value of pressure measurement values measured by the second pressure gauge of each of the flow rate controllers within a preset time period is equal to or larger than a preset value.

8. The method of claim 1, further comprising:
acquiring a first pressure measurement value measured by the first pressure gauge of each of the flow rate controllers and a second pressure measurement value measured by the second pressure gauge of each of the flow rate controllers in a state that the first valves and the second valves are closed;
acquiring an initial pressure value of the second pressure gauge corresponding to the first pressure measurement value by inputting the first pressure measurement value into a preset function; and
comparing the second pressure measurement value with the initial pressure value.

9. The method of claim 1, further comprising:
determining, in a state that the first valves and the second valves are closed, whether a difference absolute value between a moving average value of pressure measurement values measured by the first pressure gauge of each of the flow rate controllers and a moving average value of pressure measurement values measured by the second pressure gauge of each of the flow rate controllers within a preset time period is equal to or larger than a preset value.

10. The method of claim 1, further comprising:
determining whether a preset time period has elapsed in a state that the control valve of each of the flow rate controllers is closed.

11. A method of inspecting a gas supply system configured to supply a gas into a processing vessel of a substrate processing apparatus,
wherein the gas supply system comprises:
multiple first lines respectively connected to multiple gas sources;
multiple first valves respectively provided at the first lines;
multiple flow rate controllers respectively provided at downstream sides of the first lines and respectively connected to the first lines;
multiple second lines respectively provided at downstream sides of the flow rate controllers and respectively connected to the flow rate controllers;
multiple second valves respectively provided at the second lines;
a third line provided at downstream sides of the second lines and connected to the second lines; and
a third valve provided at the third line,
wherein the third line is connected to the processing vessel at a downstream side thereof,
each of the flow rate controllers comprises an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line,
the gas supply system further comprises a third pressure gauge configured to measure an internal pressure of the third line, and
wherein the method comprises:
controlling a flow rate of the gas supplied into the processing vessel via a first flow rate controller among the flow rate controllers, the flow rate of the gas being controlled according to a set flow rate in the first flow rate controller;
calculating a difference absolute value between a reference steady pressure value and a steady pressure value measured by the third pressure gauge in a steady period during which an output flow rate of the first flow rate controller is in a steady state, the reference steady pressure value being set prior to a processing period during which the controlling of the flow rate of the gas is performed and being a pressure measurement value measured by the third pressure gauge when the output flow rate of the first flow rate controller, through which the flow rate of the gas supplied into the processing vessel is controlled according to the set flow rate, is in the steady state, wherein the reference steady pressure value is pressure measurement values obtained by the third pressure gauge in a steady state during a reference period prior to the processing period; and
determining whether the output flow rate of the first flow rate controller in the steady state during the processing period is changed from the output flow rate of the first flow rate controller in the steady state during the reference period by determining whether the difference absolute value is larger than a threshold value.

12. The method of claim 11, further comprising:
calculating a sum value of pressure measurement values of the third pressure gauge at multiple time points for a transient period prior to the steady period within the processing period; and
comparing the sum value with a preset reference value.

13. A method of inspecting a gas supply system configured to supply a gas into a processing vessel of a substrate processing apparatus,
wherein the gas supply system comprises:
multiple first lines respectively connected to multiple gas sources;
multiple first valves respectively provided at the first lines;
multiple flow rate controllers respectively provided at downstream sides of the first lines and respectively connected to the first lines;
multiple second lines respectively provided at downstream sides of the flow rate controllers and respectively connected to the flow rate controllers;
multiple second valves respectively provided at the second lines;
a third line provided at downstream sides of the second lines and connected to the second lines; and
a third valve provided at the third line,
wherein the third line is connected to the processing vessel at a downstream side thereof, and
each of the flow rate controllers comprises an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line, and
wherein the method comprises:
controlling a flow rate of the gas supplied into the processing vessel via a first flow rate controller among the flow rate controllers, the flow rate of the gas being controlled according to a set flow rate in the first flow rate controller;
opening, in a processing period during which the controlling of the flow rate of the gas is performed, one or more second valves, among the second valves, which are provided at downstream sides of one or more second flow rate controllers, among the flow rate controllers, which do not perform the controlling of the flow rate of the gas;

calculating one or more first difference absolute values and one or more second difference absolute values, each of the one or more first difference absolute values being a difference absolute value between a first reference steady pressure value and a first steady pressure value measured by the first pressure gauge of each of the one or more second flow rate controllers in a steady period during which an output flow rate of the first flow rate controller is in a steady state, each of the one or more second difference absolute values being a difference absolute value between a second reference steady pressure value and a second steady pressure value measured by the second pressure gauge of each of the one or more second flow rate controllers in the steady period, each of the first reference steady pressure value and the second reference steady pressure value being set prior to the processing period, and the first reference steady pressure value and the second reference steady pressure value being pressure measurement values measured by the first pressure gauge and the second pressure gauge of each of the one or more second flow rate controllers, respectively, when the output flow rate of the first flow rate controller, through which the flow rate of the gas supplied into the processing vessel is controlled according to the set flow rate, is in the steady state;

calculating an average value of the one or more first difference absolute values and the one or more second difference absolute values; and determining whether each of the one or more first difference absolute values is larger than a first threshold value, whether each of the one or more second difference absolute values is larger than a second threshold value, or whether the average value is large than a third threshold value, wherein the control valve of each of the flow rate controllers comprises a piezoelectric element configured to move a valve body in order to open/close the control valve; and a driving unit including a control circuit configured to apply a voltage to the piezoelectric element, and the method further comprises determining whether the voltage applied to the piezoelectric element of the first flow rate controller in the processing period is equal to a reference voltage which is previously set as an application voltage to the piezoelectric element when the control valve of the first flow rate controller is fully opened, and determining the output flow rate of the first flow rate controller in the processing period is smaller than the set flow rate.

14. A method of inspecting a gas supply system configured to supply a gas into a processing vessel of a substrate processing apparatus, wherein the gas supply system comprises:

multiple first lines respectively connected to multiple gas sources;

multiple first valves respectively provided at the first lines;

multiple flow rate controllers respectively provided at downstream sides of the first lines and respectively connected to the first lines;

multiple second lines respectively provided at downstream sides of the flow rate controllers and respectively connected to the flow rate controllers;

multiple second valves respectively provided at the second lines;

a third line provided at downstream sides of the second lines and connected to the second lines; and a third valve provided at the third line, wherein the third line is connected to the processing vessel at a downstream side thereof, and each of the flow rate controllers comprises an orifice, a fourth line extended at an upstream side of the orifice and connected to the first line, a fifth line extended at a downstream side of the orifice and connected to the second line, a control valve provided at the fourth line, a first pressure gauge configured to measure an internal pressure of the fourth line between the control valve and the orifice, and a second pressure gauge configured to measure an internal pressure of the fifth line, and wherein the method comprises:

controlling a flow rate of the gas supplied into the processing vessel via a first flow rate controller among the flow rate controllers, the flow rate of the gas being controlled according to a set flow rate in the first flow rate controller;

opening, in a processing period during which the controlling of the flow rate of the gas is performed, one or more second valves, among the second valves, which are provided at downstream sides of one or more second flow rate controllers, among the flow rate controllers, which do not perform the controlling of the flow rate of the gas;

calculating one or more first difference absolute values and one or more second difference absolute values, each of the one or more first difference absolute values being a difference absolute value between a first reference steady pressure value and a first steady pressure value measured by the first pressure gauge of each of the one or more second flow rate controllers in a steady period during which an output flow rate of the first flow rate controller is in a steady state, each of the one or more second difference absolute values being a difference absolute value between a second reference steady pressure value and a second steady pressure value measured by the second pressure gauge of each of the one or more second flow rate controllers in the steady period, each of the first reference steady pressure value and the second reference steady pressure value being set prior to the processing period, and the first reference steady pressure value and the second reference steady pressure value being pressure measurement values measured by the first pressure gauge and the second pressure gauge of each of the one or more second flow rate controllers, respectively, when the output flow rate of the first flow rate controller, through which the flow rate of the gas supplied into the processing vessel is controlled according to the set flow rate, is in the steady state;

calculating an average value of the one or more first difference absolute values and the one or more second difference absolute values; and determining whether each of the one or more first difference absolute values is larger than a first threshold value, whether each of the one or more second difference absolute values is larger than a second threshold value, or whether the average value is large than a third threshold value, wherein the control valve of each of the flow rate controllers comprises a piezoelectric element configured to move a valve body in order to open/close the control valve; and a driving unit including a control circuit configured to apply a voltage to the piezoelectric element, and the method further comprises determining whether a pressure measurement value of the first pressure gauge of each of the flow rate controllers is increased by a preset value or more when the voltage applied to the piezoelectric element of each of the flow rate controllers is equal to a reference voltage which is previously set as an application voltage to the piezoelectric element when the control valve of each flow rate controller is closed.

15. The method of claim 14, further comprising:

determining whether the pressure measurement value of the first pressure gauge of each of the flow rate controllers is decreased when each of the second valves is closed and the voltage applied to the piezoelectric element of each of the flow rate controllers is equal to the reference voltage.

\* \* \* \* \*